(12) United States Patent
Kanamura

(10) Patent No.: US 7,176,120 B2
(45) Date of Patent: Feb. 13, 2007

(54) METHOD OF MANUFACTURING SEMICONDUCTOR DEVICE

(75) Inventor: Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 11/175,790

(22) Filed: Jul. 6, 2005

(65) Prior Publication Data

US 2006/0009025 A1    Jan. 12, 2006

(30) Foreign Application Priority Data

Jul. 9, 2004    (JP) .......................... P2004-202700

(51) Int. Cl.
*H01L 29/06*    (2006.01)

(52) U.S. Cl. ...................... 438/622; 438/618; 438/620; 438/637; 438/430; 438/361; 438/99

(58) Field of Classification Search ................ 438/622, 438/620, 618, 637, 361, 430, 99
See application file for complete search history.

(56) References Cited

U.S. PATENT DOCUMENTS

| | | | | |
|---|---|---|---|---|
| 6,451,683 B1 * | 9/2002 | Farrar | ........................ | 438/622 |
| 6,638,871 B2 * | 10/2003 | Wang et al. | ................. | 438/694 |
| 6,696,222 B2 * | 2/2004 | Hsue et al. | .................. | 430/313 |
| 6,812,127 B2 * | 11/2004 | Oshima et al. | .............. | 438/622 |
| 6,927,495 B2 * | 8/2005 | Arita et al. | .................. | 257/758 |
| 6,946,391 B2 * | 9/2005 | Tsai et al. | .................... | 438/638 |
| 2004/0121579 A1 * | 6/2004 | Huang et al. | ............... | 438/622 |
| 2005/0003653 A1 * | 1/2005 | Kanamura | ................... | 438/622 |

* cited by examiner

*Primary Examiner*—Thao P. Le
(74) *Attorney, Agent, or Firm*—Sonnenschein Nath & Rosenthal LLP

(57) ABSTRACT

A method of manufacturing a semiconductor device, including the steps of: forming first and second insulation films on a substrate; sequentially forming an organic sacrificing layer and first and second mask layers thereon; forming a wiring groove pattern in the second mask layer; forming a connection hole pattern for forming connection holes in the second and first mask layers and the organic sacrificing layer; forming a wiring groove pattern in the first mask layer and the organic sacrificing layer and forming the connection holes in the second insulation film, by etching conducted by use of the second and first mask layers as an etching mask; and forming the wiring grooves in the second insulation film and forming the connection holes in the second and first insulation films, by use of the first mask layer and the organic sacrificing layer as a mask.

22 Claims, 10 Drawing Sheets

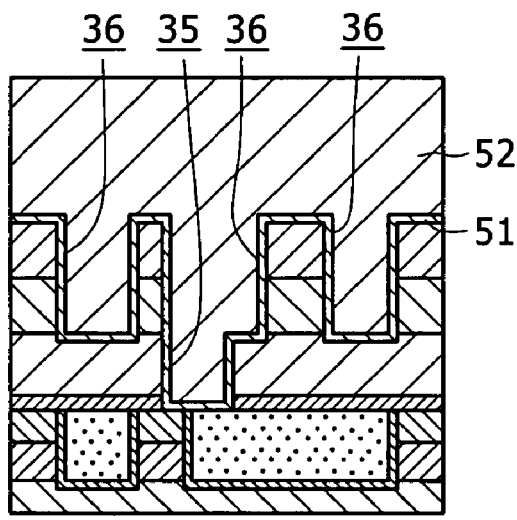
F I G . 2 A
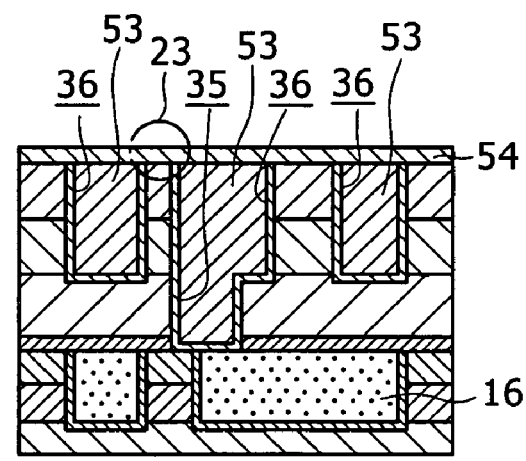
F I G . 2 B

METHOD OF MANUFACTURING SEMICONDUCTOR DEVICE

RELATED APPLICATION DATA

The present application claims priority to Japanese Application(s) No(s). P2004-202700 filed Jul. 9, 2004, which application(s) is/are incorporated herein by reference to the extent permitted by law.

BACKGROUND OF THE INVENTION

The present invention relates to a method of manufacturing a semiconductor device by which miniaturization of a wiring and enhancement of the degree of integration are facilitated while securing a voltage resistance between conductor layers used for wiring.

Attendant on the miniaturization of and enhancement of the degree of integration of semiconductor devices, the delay of electric signals due to the time constant of the wiring becomes a serious problem. For the conductor layers used in a multi-layer wiring step, the copper (Cu) wiring has come to be introduced in place of the wiring formed by use of an aluminum (Al) based alloy. Unlike the metallic materials used in the past for multi-layer wiring structures such as aluminum, copper is difficult to pattern by etching and, therefore, the so-called groove wiring technology (e.g., the Damascene process) is generally used in which wiring grooves are preliminarily formed between layers and are filled with copper to form a wiring pattern. Particularly, the methods in which connection holes and wiring grooves are preliminarily formed and both the holes and grooves are simultaneously filled with copper (e.g., the dual Damascene process) are effective for reducing the number of steps (see Japanese Patent Laid-open No. Hei 11-045887).

In addition, since an increase in the wiring capacity leads to a lowering in the operating speed of the device, a minute multi-layer wiring in which a low dielectric constant film is used as an interlayer insulation film is keenly needed. Examples of the material for the low dielectric constant interlayer insulation film include not only a fluorine-containing silicon oxide (FSG) having a dielectric constant of about 3.5 and having hitherto been used comparatively satisfactorily but also low dielectric constant films having a dielectric constant of about 2.7 such as organic silicon-based polymers represented by polyaryl ether (PAE) and inorganic materials represented by hydrogen silsesquioxane (HSQ) and methyl silsesquioxane (MSQ); in recent years, even the materials obtained by making these porous to attain a dielectric constant of about 2.2 have come to be introduced on trial.

In the case of applying the dual Damascene process to the low dielectric constant interlayer insulation film, it is desired for the process to overcome the following technical limitations.

First, since the composition of the low dielectric constant film is close to the composition of the resist used for patterning, the low dielectric constant film would also be liable to damage during the process of resist removal. Specifically, it is keenly desired that the resist peeling treatment after the etching by use of the resist mask and the resist regenerating treatment conducted when the treated resist pattern does not comply with the product specifications can be carried out without damaging the low dielectric constant film.

Next, problems might be generated in applying the process to a so-called borderless structure which lacks a margin in matching between the wiring and the connection hole. Attendant on the miniaturization of semiconductor devices, at least in the cases of multi-layer wirings of the 0.18 μm generation and the latter generations, it is a major premise that the machining process can cope with the borderless structure. Therefore, also in the case of simultaneous formation of wiring grooves and connection holes in an inter-layer insulation film including a low dielectric constant film by the dual Damascene process, it is keenly desired that the process have little variations in via resistance due to misalignment.

In addition, in order to form the wiring grooves with good depth controllability, there may be need for the presence of an etching inhibitive film near the bottom portions of the wiring grooves. However, where the etching inhibitive film with a comparatively high dielectric constant is inserted as an intermediate layer, an increase in inter-layer capacity would result. Therefore, the dual Damascene process to be applied to the low dielectric constant film inter-layer structure may be required to be able to suppress the increase in capacity while controlling the formation of the wiring grooves.

Dual Damascene processes paying attention to the above-mentioned technical limitations have been disclosed (refer to, for example, Japanese Patent Laid-open Nos. 2000-150519 and 2001-44189). Besides, the present inventors have devised a dual Damascene process for a low dielectric constant film inter-layer structure including an organic film using a three-layer hard mask, as a dual Damascene process for a low dielectric film inter-layer structure capable of coping with high-performance devices of the 65 nm generation and the latter generations (refer to, for example, R. Kanamura et al, "Integration of Cu/low-k Dual-Damascene Interconnects with a Porous PAE/SiOC Hybrid Structure for 65 nm-node High Performance eDRAM", 2003 Symposium on VSI Technology Digest of Technical Papers, pp. 107–108 (2003)).

According to the dual Damascene process devised by the present inventors, it is possible to easily form openings between connection hole layers composed of carbon-containing silicon oxide films while reducing the hard mask steps in resist patterning of connection holes, and it is possible to form dual Damascene wirings with good control of the wiring depth and the connection hole shape, even in the 100 nm half pitch minute multi-layer wiring of the 65 nm generation.

However, some technical barriers are present in the case where a next-generation multi-layer wiring for which further miniaturization and further lowering in dielectric constant are desired is formed by use of the dual Damascene process devised by the present inventors. The problems present in this case will be described referring FIGS. 9 and 10.

As shown in FIG. 9A, an interlayer insulation film 112 is formed on an under insulation film 111 deposited on a substrate (not shown). The interlayer insulation film 112 is formed, for example, by use of a laminate film composed of an organic film 113 and a silicon oxide ($SiO_2$) film 114. The interlayer insulation film 112 is provided with a first wiring 116 by filling wiring grooves 115 with a copper (Cu) film through a close contact layer, a barrier meta layer or the like therebetween. In addition, an oxidation inhibitive layer 117 is formed on the first wiring 116 by use of a silicon carbide (SiC) film, for example.

Subsequently, a first insulation film 118 between connection hole layers is formed. As the first insulation film 118, a carbon-containing silicon oxide (SiOC) film was adopted. Next, a second insulation film 119 is formed on the first insulation film 118. As the second insulation film 119, a film of an organic polymer having a dielectric constant of about 2.6 is formed. In an embodiment, a polyaryl ether (PAE) film was formed as an example.

Subsequently, a first mask layer 131, a second mask layer 132, and a third mask layer 133 are sequentially formed on the second insulation film 119. Here, the first, second, and third mask layers 131, 132 and 133 are formed by use of a light-transmitting material; as an example, the first mask layer 131 was formed by use of a carbon-containing silicon oxide (SiOC) film, the second mask layer 132 was formed by use of a silicon nitride (SiN) film, and the third mask layer 133 was formed by use of a silicon oxide ($SiO_2$) film. Thereafter, a resist mask 141 for formation of wiring grooves is formed on the third mask layer 133. The resist mask 141 is provided with opening portions 142 for formation of a wiring groove pattern.

Next, as shown in FIG. 9B, dry etching is conducted by use of the resist mask 141 [see FIG. 9A] as an etching mask, to form a wiring groove pattern 134 in the third mask layer 133. In addition, after the etching of the third mask layer 133, an ashing treatment based on an oxygen ($O_2$) plasma and a treatment with an organic amine-based chemical, for example, are carried out, to completely remove the resist mask 141 and the residual deposits left upon the etching treatment.

Next, a resist mask 143 for formation of a connection hole pattern is formed. The resist mask 143 is provided with opening portions 144 for formation of connection holes. In addition, the resist mask 143 is so formed as to partly overlap with the wiring groove pattern 134 in the third mask layer 133. The resist mask 143 in relation to the formation of connection holes is so formed as to be aligned with the first wiring 116 or the wiring groove pattern 134; in this case, due to misalignment which may be generated on a lithography process basis and size dispersions of each layer, a region 122 constituting a borderless structure in relation to the wiring groove pattern 134 would be generated.

In the next place, as shown in FIG. 9C, by use of the resist mask 143 [see FIG. 9B] for connection hole pattern as an etching mask, a connection hole pattern 135 is formed in the third mask layer 133, the second mask layer 132, and the first mask layer 131 by a dry etching process. Further, connection holes 136 are formed in the second insulation film 119. Here, the resist mask 143 can be removed simultaneously by the etching treatment applied to the second insulation film 119 composed of the polyaryl ether film. In addition, the resist mask 143 gradually retreats into the openings in the second insulation film 119 composed of the polyaryl ether film, but the presence of the second mask 132 composed of the SiN film ensures that a good opening shape can be obtained.

Next, as shown in FIG. 9D, by use of the third mask 133 provided with the wiring groove pattern 134 as an etching mask, the wiring groove pattern 134 is extendedly formed in the SiN film of the second mask layer 132 by a dry etching process. In this case, upper portions of the first mask layer 131 are also etched. In addition, in the step of etching the second mask layer 132 by use of the third mask layer 133, the wiring groove pattern 134 can be extendedly formed through the second insulation film 119 composed of the organic film and exposed at bottom portions of the connection holes 136 to an intermediate portion of the first insulation film 118 composed of the SiOC film. Specifically, the etching selectivity ratio (SiN/SiOC) of the silicon nitride film of the second mask layer 132 to the SiOC film in this etching can be set to be less than 1 (one), and, therefore, in the case of etching the SiN film having a thickness of 50 nm, for example, it is possible to form the connection holes 136 in the SiOC film with a depth of about 80 nm inclusive of the required over-etching amount.

In the next place, as shown in FIG. 9E, the connection holes 136 are completely formed in the first insulation film 118 composed of the SiOC film. Here, the first mask layer 131 composed of the $SiO_2$ film remaining in the wiring groove regions is simultaneously removed, by using as an etching mask the second mask layer 132 composed of the SiN film provided with the wiring groove pattern 134. It should be noted here that, during this etching step, carbon coming from the SiOC film of the first mask layer 131 is supplied in excess into the etching atmosphere in the wiring groove pattern 134 to be a large-width wiring, with the result that a stop of etching of the SiOC film would be liable to be generated. Therefore, the etching selectivity ratio (SiOC/SiN) relative to the SiN film under this etching condition is desired to set to a condition promising an enhancement of selective removal property, i.e., a ratio value of less than about 10, and the wiring groove pattern 134 formed in the SiOC film of the first mask 131 would have a shape emphasized in the so-called corner collapse. Besides, in the regions where the above-mentioned connection holes 136 and wiring groove pattern 134 have the borderless structure and where the adjacent wiring groove patterns 134 are laid out with a minimum space, the space between the wirings is narrowed, so that the corner collapse would tend to be further accelerated.

Thereafter, as shown in FIG. 9F, the polyaryl ether film of the second insulation film 119 remaining at bottom portions of the wiring groove pattern 134 is etched to form wiring grooves 137, and the SiC film of the oxidation inhibitive layer 117 present at bottom portions of the connection holes 136 is etched to further extend the connection holes 136. This results in that the connection holes 136 reach the first wiring 116. In this manner, the predetermined so-called dual Damascene processing is completed. The narrow space regions generated due to the misalignment in the connection hole patterning and the size dispersions mentioned above would not be broadened, through the spaces might be narrowed due to a further increase of the corner collapse. Incidentally, the SiN film of the second mask layer 131 left in the outside of the wiring groove regions is removed during the process of etching the SiC film of the oxidation inhibitive layer 117 at the bottom portions of the connection holes 136.

Next, by an after-treatment using an appropriate liquid chemical and a hydrogen annealing treatment, the etching deposits remaining on side walls of the wiring groove and the connection holes and the denatured Cu layer at bottom portions of the connection holes are cleaned up. Thereafter, as shown in FIG. 10A, a Ta film as a barrier metal layer 151, for example, is formed on the inside surfaces of the wiring grooves 137 and the connection holes 136 by a sputtering process, and, though not shown, a copper seed layer is formed and then a copper film 152 is deposited by an electroplating process, or the copper film 152 is deposited by a sputtering process. By this, the wiring grooves 137 and the connection holes 136 can be filled (buried) with a conductor film by use of copper. As the conductor film, other metallic materials than copper can also be used.

Further, of the copper film 152 and the barrier metal layer 151, the portions unnecessary for forming the second wiring are removed by a chemical mechanical polishing (CMP) process, whereby the second wiring 153 is completed in the wiring grooves 137, as shown in FIG. 10B, and parts thereof are connected to the first wiring 116 through the connection holes 136. By this a multi-layer wiring structure of the so-called dual Damascene structure is obtained. In addition, in the same manner as the first wiring 116 of the lower layer wiring, an oxidation inhibitive layer 154 for covering the second wiring 153 is formed by use of an SiC film, for example. However, at the narrow space portions generated due to the misalignment in the connection hole pattering and to the size dispersions mentioned above, regions 125 where the separation between the wiring is not satisfactory have been formed.

In relation to the multi-layer wiring formed by the dual Damascene process as above-mentioned, there has been confirmed a lowering in yield due to the shortcircuit defects between the wiring and the adjacent different-potential wiring, because of the generation of the regions 125 where the separation between the wirings are locally insufficient. Besides, it has been found that, even in the case where the different-potential wirings are separated within the range of operation of the semiconductor device, initial defects or wear faults due to an insufficient withstand voltage may be generated in cases of a separation width of 25 nm or less.

Prevention of the short-circuit defects and securing of the withstand voltage, in the wirings connected through the connection holes 136, have come to be serious problems in attendant on the progress of miniaturization.

A first one of the reasons is a reduction of the space between the wirings. For example, the space between the wirings is reduced to a minimum of 100 nm under the 65 nm generation design rule and to about 70 nm under the 45 nm generation design rule, and it is difficult in principle to improve the misalignment in the lithography process by an amount corresponding to the reduction of the space.

A second one of the reasons lies in that the degree of reduction in the opening size of the connection holes 136 is very high. In ordinary lithography processes, stable formation of the openings of the connection holes 136 becomes conspicuously difficult when the opening size becomes 120 nm or less. In addition, the degrees of difficulty in securing the wiring reliability concerning the subsequent filling-with-metal process, the reduction of resistance of the connection holes, stress migration, etc. are also raised. Therefore, the final opening size tends to remain on the greater side as compared with the reduction ratio of the inter-wiring space, which leads to a further difficulty in securing the required space between the wirings.

A third one of the reasons lies in that attendant on the miniaturization of wiring, the lowering of the dielectric constant of the insulation film is enlarged so as to reduce the capacity of the wiring, so that the withstand voltage of the film itself is lowered. Accordingly, the withstand voltage limit width tends rather to be enlarged, which again leads to a difficulty in securing the required space between the wirings.

SUMMARY OF THE INVENTION

It is desirable to solve the problem that prevention of the shortcircuit defects between wirings connected through connection holes and securing of the withstand voltage make it difficult to secure the required space between the wirings, as miniaturization progresses.

A first one of the reasons is the reduction of the space between the wirings. For example, the space between the wirings is reduced to a minimum of 100 nm under the 65 nm generation design rule and to about 70 nm under the 45 nm generation design rule, and it is difficult in principle to improve the misalignment in the lithography process by an amount corresponding to the reduction of the space.

A second one of the reasons lies in that the degree of reduction in the opening size of the connection holes is very high. In ordinary lithography processes, stable formation of the openings of the connection holes becomes considerably difficult when the opening size is reduced to 120 nm or less. In addition, the degrees of difficulty in securing the wiring reliability concerning the subsequent filling-with-metal process, the lowering in resistance of the connection holes, stress migration, etc. are also raised. Therefore, the final opening size tends to remain on the greater side as compared with the reduction ratio of the inter-wiring space, which leads to a further difficulty in securing the required space between the wirings.

A third one of the reasons lies in that attendant on the miniaturization of a wiring, the lowering of the dielectric constant of the insulation film is enlarged so as to reduce the capacity of the wiring, so that the withstand voltage of the film itself is lowered. Accordingly, the withstand voltage limit width tends to be rather enlarged, which again leads to a difficulty in securing the space between the wirings.

According to an embodiment of the present invention, there is provided a method of manufacturing a semiconductor device, including the steps of: laminating a first insulation film and a second insulation film which includes an organic insulation film, on a substrate; sequentially laminating an organic sacrificing layer, a first mask layer and a second mask layer on the second insulation film; forming a wiring groove pattern for processing a wiring groove in the second mask layer; forming a connection hole pattern for forming a connection hole in the second mask layer, the first mask layer and the organic sacrificing layer; forming a wiring groove pattern in the first mask layer and the organic sacrificing layer and forming a connection hole in the second insulation film, by etching using the second mask layer and the first mask layer as an etching mask; and forming a wiring groove in the second insulation film and forming a connection hole in the second insulation film and the first insulation film, by using the first mask layer and the organic sacrificing layer as a mask.

In the method of manufacturing a semiconductor device according to the present invention, the organic sacrificing layer, the first mask layer and the second mask layer are sequentially laminated on the second insulation layer, i.e., the organic sacrificing layer is provided between the second insulation film and the first mask layer, so that the formation of wiring grooves in the second insulation film composed of an SiOC film, which has in related art been accompanied by difficulties in controlling the processed shapes, can be carried out easily, and the formation of a multi-layer wiring with low capacity and high performance can be realized without being influenced by the low dielectric constant film material applied to the second insulation film. Therefore, in the formation of a multi-layer wiring of the dual Damascene structure applied to the interlayer insulation film including the low dielectric constant film, it is possible to easily achieve the dual Damascene processing with little corner collapse and with the processing conversion difference controlled. This makes it possible to suppress or restrain the lowering in the yield of the product due to shortcircuits between the wirings, and to suppress or restrain the deterioration of the wiring reliability concerning initial defects due to insufficient withstand voltage, inter-wiring TDDB (Time Dependence Dielectric Breakdown), or the like. Besides, from the viewpoint of coping with miniaturization on the order of the 65 nm generation and the latter generations, also, the present invention making it possible to secure the space between wirings with good controllability promises the same effects as above. Furthermore, by combining the inventive method with a method of forming connection holes which are self-aligning relative to the wiring grooves, it is possible to manufacture a semiconductor device with a sufficient separation margin.

There is a need for a method of manufacturing a semiconductor device having a multi-layer wiring with high performance, high yield and high reliability by preventing defects due to shortcircuit with a different-potential wiring adjacent to connection holes, without sacrificing the opening properties and reliability of the connection holes, even in a minute multi-layer wiring in which a low dielectric constant film of the 65 nm generation or the latter generation is used. The need has been fulfilled by laminating an organic sacrificing layer, a first mask layer and a second mask layer on a second insulation film, since the margin in the thickness direction of the first mask layer can thereby be enlarged by the presence of the organic sacrificing layer, the accuracy in opening the wiring grooves and connection holes in the second insulation film can be enhanced, and the defects due to shortcircuit with the adjacent different-potential wiring can be thereby prevented.

BRIEF DESCRIPTION OF THE DRAWINGS

FIGS. 2A and 2B are schematic sectional views showing the first embodiment of the method of manufacturing a semiconductor device according to the present invention;

DETAILED DESCRIPTION OF THE PREFERRED EMBODIMENTS

[First Embodiment]

A first embodiment of the method of manufacturing a semiconductor device according to the present invention will be described referring to manufacturing step sectional views shown in FIGS. 1A to 1F and FIGS. 2A and 2B.

Figure 1A:
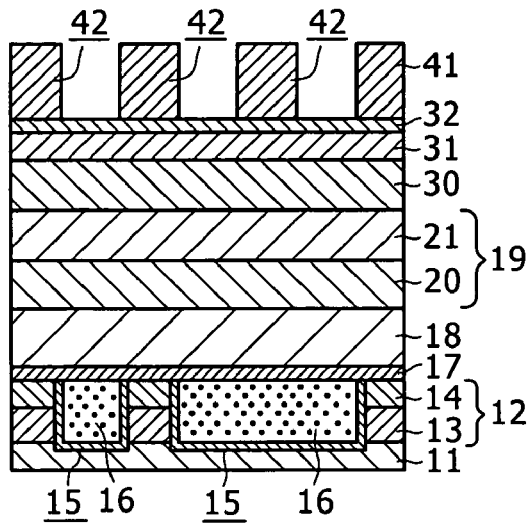
FIGS. 1A to 1F are schematic sectional views showing a first embodiment of the method of manufacturing a semiconductor device according to the present invention.

As shown in FIG. 1A, an interlayer insulation film 12 is formed on an under insulation film 11 deposited on a substrate (not shown). The interlayer insulation film 12 is formed, for example, by forming a laminate film including an organic film 13 and a silicon oxide ($SiO_2$) film 14. The interlayer insulation film 12 is provided with a first wiring 16 in wiring grooves 15, with a close contact layer, a barrier metal layer or the like therebetween. The first wiring 16 is formed to have a wiring thickness of about 150 nm by burying a copper (Cu) film, for example. In addition, an oxidation inhibitive layer 17 is formed on the first wiring 16. The oxidation inhibitive layer 17 is formed, for example, by forming a silicon carbide (SiC) film in a thickness of 35 nm.

Subsequently, a first insulation film 18 between connection hole layers is formed. As the first insulation film 18, a carbon-containing silicon oxide (SiOC) film was formed in a thickness of 135 nm. For formation of the SiC film and the SiOC film, as one example, a parallel flat plate type plasma CVD apparatus was used; as for the raw material gas, methylsilane was used as a silicon source in both cases of the films. The film forming conditions were a substrate temperature of 300 to 400° C., a plasma power of 150 to 350 W, and a film forming atmosphere pressure of about 100 to 1000 Pa. The SiC film and the SiOC film could be formed to have dielectric constants of about 3.8 and about 2.6, respectively.

Next, a second insulation film 19 is formed on the first insulation film 18. As the second insulation film 19, an organic film 20 with a dielectric constant of about 2.6 and an SiOC film as a protective film 21 on the organic film 20 are formed. As an example, in this embodiment, a polyaryl ether (PAE) film was formed in a thickness of 110 nm as the organic film 20. The polyaryl ether can be formed by depositing a precursor by a spin coating method, followed by a curing treatment at 350 to 450° C. Other than the polyaryl ether, there may also be used benzocyclobutene (BCB), a polyimide film, an amorphous carbon film, or the like. The SiOC film constituting the protective film 21 was formed in a thickness of 145 nm by use of the same CVD apparatus as for the first insulation film 18 between the connection hole layers, under such conditions as to obtain a dielectric constant of about 3.0. In forming the protective film 21, particularly in the case where the so-called selective removal property in the subsequent etching would be a problem, it is desirable to form an SiOC film containing oxygen in an amount greater than the stoichiometric amount.

Subsequently, an organic sacrificing layer 30, a first mask layer 31, and a second mask layer 32 are sequentially formed on the second insulation film 19. As one example, the organic sacrificing layer 30 was composed of a polyaryl ether film, with a thickness of 150 nm, for example. Other than the polyaryl ether film, there can be used a BCB film, a polyimide film, an amorphous carbon film, or a resist film of a highly heat-resistant novolak resin or the like, as the organic sacrificing layer 30. The film thickness of the organic sacrificing layer 30 is not limited to 150 nm, inasmuch as the layer can be applied as an etching mask in the subsequent step and can be etched by using as a mask the first and second mask layers constituting an upper hard mask. The first mask layer 31 was composed of a silicon nitride (SiN) film having a thickness of 50 nm. Further, the second mask layer 32 was formed of an $SiO_2$ film having a thickness of 35 nm. Thereafter, a resist mask 41 for formation of wiring grooves is formed on the second mask layer 32. The resist mask 41 is provided with opening portions 42 for forming a wiring groove pattern.

The $SiO_2$ film constituting the second mask layer 32 can be formed by a plasma CVD process, using monosilane ($SiH_4$) as a silicon source and dinitrogen monoxide ($N_2O$) gas as an oxidant. In forming the $SiO_2$ film constituting the first mask layer 31, particularly in the case where oxidation of the organic sacrificing layer 30 composed of the lower PAE film is a problem, it is desirable to form a silicon oxide film richer in silicon than stoichiometry. The SiN film constituting the first mask layer 31 an be formed by use of the same plasma CVD apparatus as for the $SiO_2$ film, while using monosilane ($SiH_4$) as a silicon source, ammonia ($NH_3$) gas as a nitriding agent, dinitrogen monoxide ($N_2O$) gas as an oxidant, and an inert gas as a carrier gas.

Figure 1D:
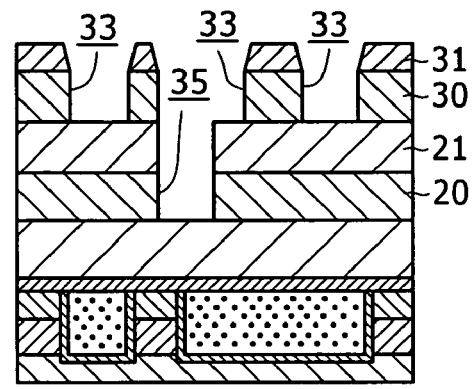
Figure 1B:
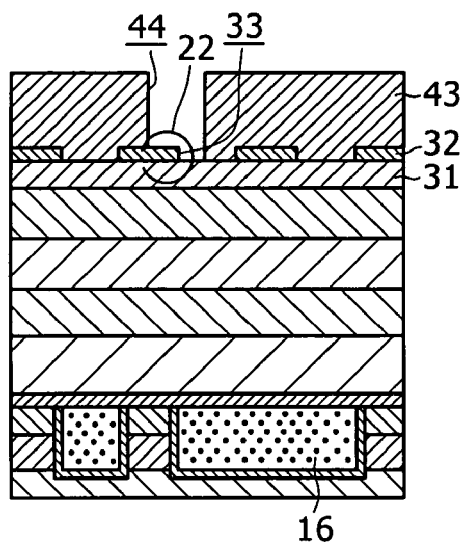

Next, as shown in FIG. 1B, dry etching is conducted by use of the resist mask 41 [see FIG. 1A] as an etching mask, to form a wiring groove pattern in the second mask layer 32. The etching may be carried out by use of an etching apparatus of the general magnetron system, while using octafluorobutane ($C_4F_8$), carbon monoxide (CO) and argon (Ar) as an etching gas, with a gas flow rate ratio ($C_4F_8$:CO:Ar) of 1:5:20, a bias power of 1200 W, and a substrate temperature of 20° C. Since an etching selectivity ratio ($SiO_2$/SiN) to the SiN film of not less than 10 can be obtained under these etching conditions, the SiN film constituting the first mask layer 31 serving as an under layer is little dug. Besides, after the etching of the second mask layer 32, an ashing treatment based on an oxygen ($O_2$) plasma, for example, and a treatment with an organic amine-based liquid chemical are performed, whereby the resist mask 41 and the deposits left upon the etching treatment can be completely removed.

In the next place, a resist mask 43 for forming a connection hole pattern is formed. The resist mask 43 is provided with opening portions 44 for formation of connection holes. The resist mask 43 is so formed as to at least partly overlap with the wiring groove pattern 33 in the second mask layer 32. In addition, since steps generated at the wiring groove pattern 33 in the second mask layer 32 are suppressed to about 35 nm, which corresponds generally to the film thickness of the second mask layer 32, a good resist mask shape for connection holes can be obtained with substantially the same lithography characteristics as in the case of patterning a flat portion. Besides, even in the case of using a coating type anti-reflection film (e.g., BARC) together, variations in the burying shape of the anti-reflection film are suppressed to a faint degree according to the size and the degree of denseness of the second mask layer 32, so that worsening of the resist shape at the time of a light exposure treatment and dispersion of focal depth tending to cause variations in size can be reduced.

The resist mask 43 for formation of connection holes is so formed as to be aligned to the first wirings 16 or the wiring groove pattern 33; in this case, due to the misalignment which may be generated on a lithography process basis and the dispersions of size of each layer, regions 22 constituting a borderless structure relative to the wiring groove pattern 33 are generated.

Figure 1E:
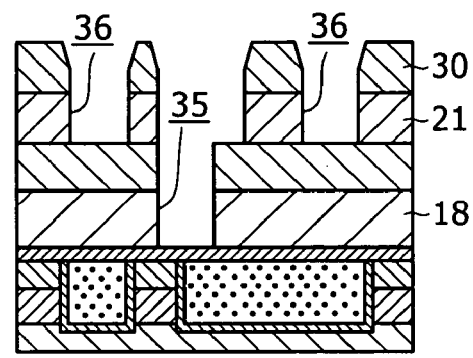
Figure 1C:
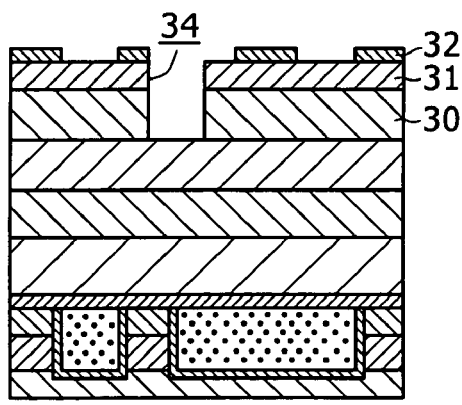

Next, as shown in FIG. 1C, a dry etching process is conducted using the resist mask 43 [see FIG. 1B] as an etching mask, to form a connection hole pattern 34 in the second mask layer 32 and the first mask layer 31. Further, the connection hole pattern 34 is formed extendedly into the organic sacrificing layer 30. Here, the resist mask 43 can be removed simultaneously with the etching treatment of the organic sacrificing layer 30.

The formation of the connection hole pattern 34 in the range to the laminate hard mask is carried out using an etching apparatus of the general magnetron system, with octafluorobutane ($C_4F_8$) and argon (Ar) used as an etching gas and with a bias power set to 400 W. The gas flow rate ratio ($C_4F_8$:Ar) was 1:4, and the substrate temperature was set to 20° C. The etching selectivity ratio ($SiO_2$/SiN) under these etching conditions is around 1 (one), and the connection hole pattern 34 can be formed in the laminate mask in one step; in the case where the resist selectivity ratio, the etching conversion difference or the like is a problem, however, the objective mask material may be sequentially removed selectively relative to the under insulation film by two-step etching.

The formation of the connection hole pattern 34 in the organic sacrificing layer 30 was carried out by use of an ordinary high-density plasma etching apparatus, with ammonia ($NH_3$) as an etching gas. The RF power was 150 W, and the substrate temperature was 20° C. Since the etching rate of the resist film 43 under these conditions is roughly equal to that of the organic sacrificing layer 30, the resist mask 43 gradually retreats during the etching of the organic sacrificing layer 30; however, due to the presence of the second mask layer 32 or the first mask layer 31 in the laminate hard mask, the connection hole pattern 34 with good opening shape can be obtained. By the way, under these etching conditions, the etching selectivity ratio of the organic sacrificing layer 30 to the SiN film, the $SiO_2$ film or the SiOC film can have a value of 100 or more.

Next, as shown in FIG. 1D, by use of the second mask layer 32 [see FIG. 1B] provided with the wiring groove pattern 33 as an etching mask, a dry etching process is carried out to extendingly form the wiring groove pattern 33 into the SiN film of the first mask layer 31. This etching is carried out by use of an etching apparatus of the general magnetron system, with difluoromethane ($CH_2F_2$), oxygen ($O_2$) and argon (Ar) as an etching gas, a gas flow rate ratio ($CH_2F_2$:$O_2$:Ar) of 2:1:5, and a bias power of 100 W. The selectivity ratio (SiN/$SiO_2$) to the $SiO_2$ film under these etching condition can be about 3, so that the first mask 31 with a thickness of 50 nm can be etched with good margin inasmuch as the $SiO_2$ film of the second mask layer 32 has a thickness of about 25 nm, for example.

In addition, since the etching selectivity ratio (SiN/SiOC) to the SiOC film under the etching conditions is about 1 (one), in the case of etching the first mask layer 31 composed of the SiN film with a thickness of 50 nm, the protective film 21 composed of the SiOC film is provided with connection holes 35 to a depth of 80 nm, inclusive of the required over-etching amount. Therefore, the connection holes 35 must be completely opened by changing the film thickness configuration of the second mask layer 32 and the first mask layer 31 which constitute the hard mask, or an etching for complete opening in the protective film 21 by use of the first mask 31 must be added. In this embodiment, as an additional etching, complete opening in the protective film 21 was carried out by use of an etching apparatus of the general magnetron system, with octafluorocyclopentene ($C_5F_8$), carbon monoxide (CO), argon (Ar) and oxygen ($O_2$) as an etching gas, a gas flow rate ratio ($C_5F_8$:CO:Ar:$O_2$) of 1:10:5:1, a bias power of 1600 W, and a substrate temperature of 20° C. The formation of the connection holes 35 in the organic film 20 composed of the polyaryl ether film and the formation of the wiring groove pattern 33 in the organic sacrificing layer 30 were carried out by anisotropic etching using a high-density plasma etching apparatus with ammonia ($NH_3$) gas, in the same manner as the formation of the connection hole pattern 34 in the organic sacrificing layer 30.

Next, as shown in FIG. 1E, the connection holes 35 are formed in the first insulation film 18 composed of the SiOC film. Here, the protective film 21 composed of the SiOC film remaining in the wiring groove regions is simultaneously removed by using as an etching mask the first mask layer 31 [see FIG. 1D] composed of the SiN film provided with the wiring groove pattern 33, with the result of formation of wiring grooves 36. This etching is carried out, for example, by use of an etching apparatus of the general magnetron system, with octafluorocylopentene ($C_5F_8$), carbon monoxide (CO), argon (Ar) and oxygen ($O_2$) as an etching gas, a gas flow rate ratio ($C_5F_8$:CO:Ar:$O_2$) of 1:10:5:5, a bias power of 1600 W, and a substrate temperature of 20° C. Here, the etching conditions were set for good selective removal property, for forming the wiring grooves 36 to be wide opening portions in the protective film 21, and, due to the presence of the thick organic sacrificing layer 30 on the lower side of the first mask layer 31, the wiring grooves 36 and the connection holes 35 controlled to shapes with very little generation of the so-called corner collapse could be formed.

Figure 1F:
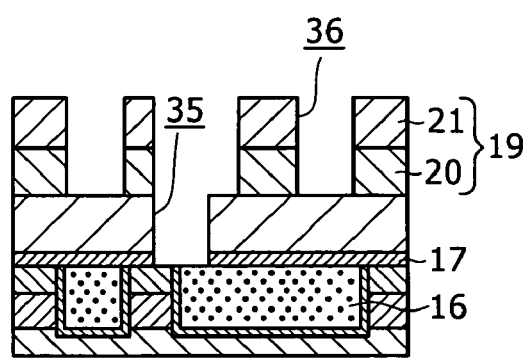

Thereafter, as shown in FIG. 1F, the organic film 20 of the second insulation film 19 remaining in bottom portions of the wiring grooves 36 is etched to complete the wiring grooves 36, and the SiC film of the oxidation inhibitive layer 17 present in bottom portions of the connection holes 35 is etched to further extendingly form the connection holes 35. As a result, the connection holes 35 reach the first wiring 16. In this manner, the so-called dual Damascene processing is completed. Incidentally, the first mask layer 31 [see FIG. 1D] composed of the SiN film is removed in the process of etching the SiC film of the oxidation inhibitive layer 17 present in bottom portions of the connection holes 35. In addition, the organic sacrificing layer 30 [see FIG. 1E] remaining outside the regions of the wiring grooves 36 is removed in the process of etching the organic film 20 between the wiring layers. Besides, since the protective film 21 composed of the SiOC film is present on the organic film 20, the surface of the organic film 20 would not be etched even if the organic sacrificing layer 30 is etched at the time of formation of the wiring grooves 36 in the organic film 20.

The formation of the wiring grooves 36 in the organic film 20 of the second insulation film 19 was carried out by use of an ordinary high-density plasma etching apparatus with ammonia ($NH_3$), for example, as an etching gas. The RF power was 150 W, and the substrate temperature was 20° C. Since the etching selectivity ratio to the SiOC film of the first insulation film 18 under these conditions can be 100 or more, the formation of the wiring grooves 36 can be performed without dispersion of depth and with good controllability.

The etching of the SiC film of the oxidation inhibitive layer 17 present in bottom portions of the connection holes 35 is carried out by use of an etching apparatus of the general magnetron system, with difluoromethane ($CH_2F_2$), oxygen ($O_2$) and argon (Ar) as an etching gas, a gas flow rate ratio ($CH_2F_2$:$O_2$:Ar) of 2:1:5, and a bias power of 100 W. It should be noted here that the selectivity ratio to the SiOC film under these etching conditions is around 1 (one), so that in the case where the digging of the SiOC film at bottom portions of the wiring grooves 36 becomes a problem, etching of the SiC film of the oxidation inhibitive layer 17 may be carried out before the formation of the wiring grooves 36 in the PAE film of the second insulation film 19. In addition, the SiN film of the second mask layer 32 remaining at upper portions of the inter-layer films (the first and second insulation films 18 and 19) can be completely removed during the etching of the SiC film of the oxidation inhibitive layer 17.

Next, an after-treatment using an appropriate liquid chemical and a hydrogen annealing treatment are conducted, whereby the deposits left upon etching at side walls of the wiring grooves 36 and the connection holes 35 and the denatured Cu layer at bottom portions of the connection holes 35 are cleaned away. Thereafter, as shown in FIG. 2A, a Ta film as a barrier metal layer 51, for example, is deposited on the inside surfaces of the wiring grooves 36 and the connection holes 35 by a sputtering process, further, a copper seed layer is formed, though not shown, and then a copper film 52 is deposited by an electroplating process, or, alternatively, the copper film 52 is deposited by a sputtering process. By this, filling of the wiring grooves 36 and the connection holes 35 with a conductor film by use of copper can be performed. Other metallic materials than copper may also be used to form the conductor film.

Further, of the copper film 52 and the barrier metal layer 51 thus deposited, the portions not required for the second wiring are removed by a chemical mechanical polishing (CMP) process, whereby the second wiring 53 is completed in the wiring grooves 36 as shown in FIG. 2B, and parts thereof are connected to the first wiring 16 through the connection holes 35. By this, a multi-layer wiring structure of the so-called dual Damascene structure is obtained. The film thickness of the second wiring 53 to be the final upper wiring is regulated to a value of about 170 nm, for example. Besides, an oxidation inhibitive layer 54 covering the second wiring 53 is formed, for example, by use of an SiC film, in the same manner as the first wiring 16 of the lower wiring.

The multi-layer wiring of the so-called dual Damascene structure formed through the above-mentioned manufacturing steps in the first embodiment is free of the formation of the so-called corner collapse shapes of the wiring grooves 36 and the connection holes 35 according to the dispersion of finished size and the misalignment of the wiring and connection holes, so that it is possible to prevent the shortcircuits to the adjacent different-potential wiring and to secure a withstand voltage. For example, inter-wiring shortcircuit would not occur in the regions 23 between the wirings 53, 53, and the wirings are held at a sufficient interval which promises a withstand voltage. Therefore, the semiconductor device produced through the multi-layer wiring process including at least the above-mentioned steps could be manufactured in a high yield.

Incidentally, the various interlayer insulation films are not limited to the kinds of films, film thickness, and the manufacturing method. The oxidation inhibitive layers 17, 54 for the copper film may be composed of SiN films formed by a CVD process, and an SiC film containing a light element such as nitrogen (N) and hydrogen (H) may also be used.

In place of the SiOC film of the first insulation film 18 to be an inter-layer film for the connection holes 35 and the SiOC film to be the protective film 21 of the organic film 20 composed of the polyaryl ether to be an inter-layer film provided with the wiring grooves 36, an SiOF film or an $SiO_2$ film formed by a CVD process or a methylsilsesquioxane (MSQ) film or a hydrogensilsesquioxane (HSQ) film formed by a spin coating process may be used, and, in place of the organic film 20 composed of the polyaryl ether, a polyarylene ether film, an amorphous carbon film or a polytetrfluoroethylene film may be applied. Further, a xecerogel film, an MSQ film or an organic polymer having a porous structure and a dielectric constant of not more than 2.2, or a combination thereof may also be applied.

In addition, while the organic sacrificing layer 30, the first mask layer 31 and the second mask layer 32 have been composed of the polyaryl ether film (150 nm), the SiN film (50 nm) and the $SiO_2$ film (35 nm) respectively from the lower side, the kind of film, film thickness and manufacturing method are in such a combination that a lower layer mask can be etched by use of an upper layer mask, and they are not limited to the above-mentioned inasmuch as the close contact property and heat resistance of the structure upon lamination can endure the subsequent etching steps. For example, the SiN film of the first mask layer 31 may be replaced by an SiC film or SiCN film formed by a CVD process, and the film thickness can be reduced inasmuch as the etching selectivity ratio permits it. Similarly, the second mask layer 32 constituting the uppermost layer may be an amorphous silicon film formed by a sputtering process. Further, a resist material such as a novolak-based resin may be applied to the formation of the organic sacrificing layer 30, the CVD films of the first and second mask layers 32 and 33 may be formed at a low temperature of 200 to 350° C., and the first and second mask layers 32 and 23 themselves may be formed of coating type materials.

While the SiOC film to be the protective film 21 of the second insulation film 19 is finally left (for example, left in a thickness of 50 nm) as the insulation film between the wiring layers in this embodiment, it can be removed in the CMP step for copper, if the close contact with the barrier metal and the mechanical strength in the CMP step of copper, or the damage upon a reducing treatment of a copper oxide carried out before the formation of the oxidation inhibitive layer 54 of copper would not be a problem.

In the manufacturing method described in the first embodiment, the organic sacrificing layer 30, the first mask layer 31 and the second mask layer 32 are sequentially laminated on the second insulation film 19, i.e., the organic sacrificing layer 30 is provided between the second insulation film 19 and the first mask layer 31. Therefore, the formation of the wiring grooves 36 in the second insulation film 19 composed of the SiOC film which has had difficulty in control of the processed shape in the method according to the related art is facilitated, and the formation of a multi-layer wiring with low capacity and high performance can be realized without being influenced by the material of the low dielectric constant film (for example, the organic film 20) applied to the second insulation film 19. Therefore, in the formation of a multi-layer wiring of the dual Damascene structure in the interlayer insulation film including a low dielectric constant film (for example, the organic film 20), it is possible to easily perform the dual Damascene processing with little corner collapse and with the processing conversion difference controlled.

In other words, by forming the organic sacrificing layer 30 on the second insulation film 19 and forming the first mask layer 31 thereon, the mask shape in the first mask layer 31 can be transferred to the organic sacrificing layer 30. Therefore, even if the first mask layer 31 is removed during the manufacturing step and the shapes on the opening side of the wiring groove pattern 33 and the connection hole pattern 34 formed in the organic sacrificing layer 30 are tapered, the shapes of the wiring groove pattern 33 and the connection hole pattern 34 on the second insulation film 19 side of the organic sacrificing layer 30 can be maintained. Accordingly, the connection holes 35 and the wiring grooves 36 can be processed into desired shapes in the second insulation film 19, and the organic sacrificing layer 30 can be removed after the formation thereof, so that the influence of the organic sacrificing layer 30 worsened in the shape on the upper side is obviated.

This makes it possible to suppress or restrain the lowering in the product yield due to shortcircuit between the wirings, and to suppress or restrain the deterioration of wiring reliability concerning the initial defects due to an insufficient withstand voltage, inter-wiring TDDB (Time Dependence Dielectric Breakdown) or the like. Besides, from the viewpoint of coping with the miniaturization concerning the 65 nm generation and the latter generations, the present invention by which the space between the wirings can be secured with good controllability promises the same effects as above. Further, combining this method with a manufacturing method in which the connection holes 35 self-aligned to the wiring grooves 36 are formed, it is possible to manufacture a semiconductor device having a sufficient separation margin. Accordingly, a high yield and a good wiring reliability could be obtained.

[Second Embodiment]

A second embodiment of the method of manufacturing a semiconductor device according to the present invention will be described referring to manufacturing step sectional views shown in FIGS. 3A to 3F and FIGS. 4A and 4B. While in the embodiment 1 the prevention of shortcircuit defects between the wiring and the connection holes and the securing of the withstand voltage were realized by improving the corner collapse shape of the wiring grooves through the laminate etching mask structure including the organic sacrificing layer, in the cases of the 32 nm generation and the latter generations there is a need for miniaturization on the order of half-pitch$\leq$60 nm and a dielectric constant reduction on the order of dielectric constant$\leq$2.2. In view of this, in the second embodiment, based on the manufacturing method in the embodiment 1, one example of a method of manufacturing a multi-layer wiring through a groove wiring structure applicable to the formation of a wiring with a minute pitch will be described below.

Figure 3A:
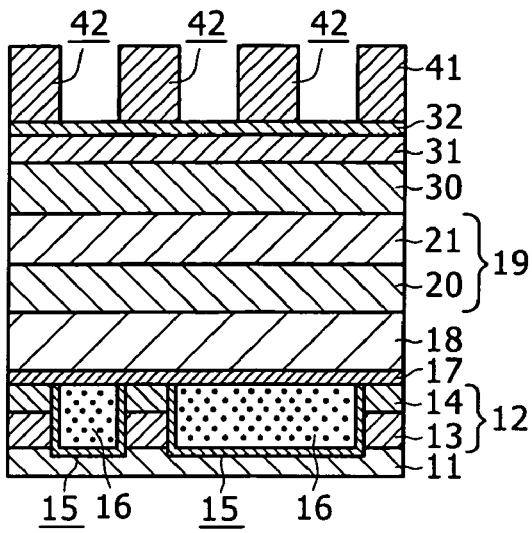
FIGS. 3A to 3F are schematic sectional views showing a second embodiment of the method of manufacturing a semiconductor device according to the present invention.

As shown in FIG. 3A, an interlayer insulation film 12 is formed on an under insulation film 11 deposited on a substrate (not shown). The interlayer insulation film 12 is formed, for example, by use of a laminate film composed of an organic film 13 and a silicon oxide ($SiO_2$) film 14. A first wiring 16 is formed in wiring grooves 15 in the interlayer insulation film 12, with a close contact layer, a barrier metal layer or the like therebetween. The first wiring 16 is formed, for example, in a wiring thickness of about 150 nm by burying a copper (Cu) film. In addition, an oxidation inhibitive layer 17 is formed on the first wiring 16. The oxidation inhibitive layer 17 is formed, for example, by forming a silicon carbide (SiC) layer in a thickness of 35 nm.

Subsequently, a first insulation film 18 between the connection hole layers is formed. As the first insulation film 18, a carbon-containing silicon oxide (SiOC) film was formed in a thickness of 135 nm. For the formation of the SiC film and the SiOC film, as an example, a parallel flat plate type plasma CVD apparatus was used, with methylsilane as a silicon source (raw material gas) in both cases. The film forming conditions are a substrate temperature of 300 to 400° C., a plasma power of 150 to 350° C., and a film forming atmosphere pressure of about 100 to 1000 Pa. The SiC film and the SiOC film could formed to have dielectric constants of about 3.8 and about 2.6, respectively.

Next, a second insulation film 19 is formed on the first insulation film 18. As the second insulation film 19, an organic film 20 with a dielectric constant of about 2.6 and an SiOC film thereon as a protective layer 21 for the organic film 20 are formed. In this embodiment, as an example, a polyaryl ether (PAE) film was formed in a thickness of 110 nm to constitute the organic film 20. The polyaryl ether film can be formed by depositing a precursor by a spin coating process, followed by a curing treatment at 350 to 450° C. Other than the polyaryl ether, there can also be used benzocyclobutene (BCB), a polyimide film, an amorphous carbon film or the like. The SiOC film as the protective film 21 was formed by use of the same CVD apparatus as for the first insulation film 18 between the connection hole layers, in a thickness of 145 nm under such conditions as to provide a dielectric constant of about 3.0. In forming the protective film 21, particularly in the case where the so-called selective removal property in the etching in the subsequent step becomes a problem, it is desirable to form an SiOC film richer in oxygen than stoichiometry.

Subsequently, an organic sacrificing layer 30, a first mask layer 31 and a second mask layer 32 are sequentially formed on the second insulation film 19. The organic sacrificing layer 30 is composed of a polyaryl ether film having a thickness of 150 nm, for example. For forming the organic sacrificing layer 30, other than the polyaryl ether film, there can also be used a BCB film, a polyimide film, an amorphous carbon film, or a resist film of a highly heat-resistant novolak resin or the like. The film thickness of the organic sacrificing layer 30 is not limited to the value of 150 nm, inasmuch as the organic sacrificing layer is applicable as an etching mask in the subsequent step and can be etched by using as a mask the first and second mask layers 31 and 32 which constitute the upper layer hard mask. The first mask layer 31 was composed of a silicon nitride (SiN) film having a thickness of 50 nm. Further, the second mask layer 32 was composed of an $SiO_2$ film having a thickness of 35 nm. Thereafter, a resist mask 41 for the formation of wiring grooves is formed on the second mask layer 32. The resist mask 41 is provided with opening portions 42 for forming a wiring groove pattern.

The formation of the $SiO_2$ film constituting the second mask layer 32 can be carried out by a plasma CVD process using monosilane ($SiH_4$) as a silicon source and dinitrogen monoxide ($N_2O$) as an oxidant. In forming the $SiO_2$ film constituting the first mask layer 31, particularly in the case where the oxidation of the organic sacrificing layer 30 composed of the polyaryl ether film becomes a problem, it is desirable to form a silicon oxide film richer in silicon than stoichiometry. The SiN film as the first mask layer 31 can be formed by use of the same plasma CVD apparatus as for the $SiO_2$ film, with monosilane ($SiH_4$) as a silicon source, ammonia ($NH_3$) as a nitriding agent, dinitrogen monoxide ($N_2O$) as an oxidant, and an inert gas as a carrier gas.

Figure 3D:
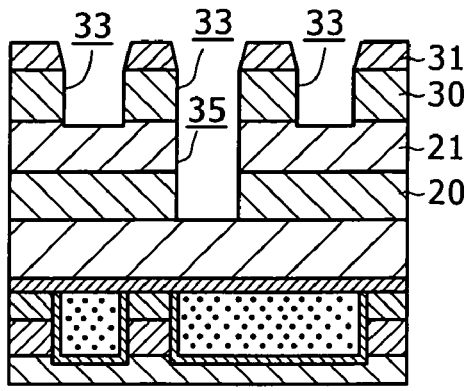
Figure 3B:
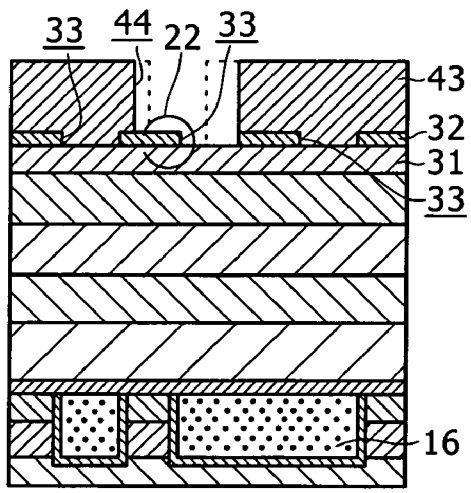

Next, as shown in FIG. 3B, by use of the resist mask 41 [see FIG. 3A] as an etching mask, dry etching is conducted to form a wiring groove pattern 33 in the second mask layer 32. This etching is carried out by use of an etching apparatus of the general magnetron system, with octafluorobutane ($C_4F_8$), carbon monoxide (CO) and argon (Ar) as an etching gas, a gas flow rate ratio ($C_4F_8$:CO:Ar) of 1:5:20, a bias power of 1200 W, and a substrate temperature of 20° C. The etching selectivity ratio ($SiO_2$/SiN) to the SiN film under these etching conditions can be 10 or more, so that the SiN film to be the first mask layer 31 as an under layer is little dug. Besides, after the etching of the second mask layer 32, an ashing treatment based on oxygen ($O_2$) plasma, for example, and a treatment with an organic amine-based liquid chemical are conducted, whereby the resist mask 41 and the deposits left upon the etching treatment can be completely removed.

Next, a resist mask 43 for the formation of a connection hole pattern is formed. The resist mask 43 is provided with opening portions 44 for the formation of connection holes.

Here, as for the opening portions 44 relative to the wiring groove pattern 33, the diameter of the opening portions 44 is so regulated that a portion of not less than the minimum wiring width will be covered. In the drawing, the portion indicated by broken lines is the range of errors. For example, in the case where it is desired to form connection holes of φ100 nm in relation to the wiring grooves with a half-pitch of 100 nm, if the conversion difference of the minimum wiring size from the wiring groove pattern 33 is about 20 nm and the misalignment is 30 nm at maximum, the wiring groove pattern 33 is set to a size of (wiring minimum line width 100 nm)−(conversion difference 20 nm)+(maximum misalignment 30 nm)×2=140 nm. Besides, where it is desired to form connection holes of φ50 nm in relation to the wiring grooves with a half-pitch of 50 nm, if the conversion difference of the minimum wiring size from the wiring groove pattern 33 is about 15 nm and the misalignment is 20 nm at maximum, the wiring groove pattern 33 is set to a size of (wiring minimum line width 50 nm)−(conversion difference 15 nm)+(maximum misalignment 20 nm)×2=75 nm. In this embodiment, a trial example with the former dimensions is shown.

In addition, steps generated at the wiring groove pattern 33 in the second mask layer 32 are suppressed to about 35 nm which corresponds generally to the film thickness of the second mask layer 32, so that a good resist mask shape of connection holes can be obtained with substantially the same lithography characteristics as in the case of patterning a flat portion. Even where a coating type anti-reflection film (for example, BARC) is used together, variations in the burying shape of the anti-reflection film are suppressed to be faint, according to the size and the degree of denseness of the second mask layer 32, and worsening of the resist shape at the time of a light exposure treatment and dispersion of focal depth which would cause size variations can be reduced.

The resist mask 43 for forming the connection holes is so formed as to be aligned relative to the first wiring 16 or the wiring groove pattern 33, and, due to the misalignment which may be generated on a lithography process basis and the size dispersions of each layer, regions 22 of a borderless structure relative to the wiring groove pattern 33 are generated.

Figure 3E:
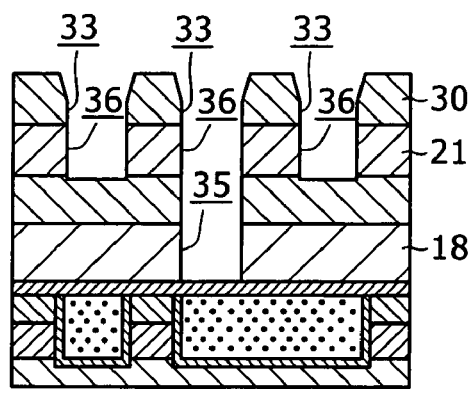
Figure 3C:
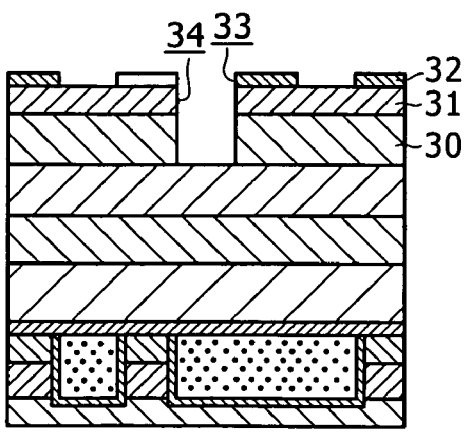

Next, as shown in FIG. 3C, by using as an etching mask the resist mask 43 [see FIG. 3B] for forming a connection hole pattern, a dry etching process is conducted to form a connection hole pattern 34 in the second mask layer 32 and the first mask layer 31. Further, the connection hole pattern 34 is formed extendedly into the organic sacrificing layer 30. Here, the resist mask 43 can be simultaneously removed by the etching treatment of the organic sacrificing layer 30.

This etching is carried out by use of an etching apparatus of the general magnetron system, with difluoromethane ($CH_2F_2$), oxygen ($O_2$) and argon (Ar) as an etching gas, a gas flow rate ratio ($CH_2F_2$:$O_2$:Ar) of 2:1:5, and a bias power of 100 W. Since the etching selectivity ratio (SiN/$SiO_2$) to the $SiO_2$ film under these etching conditions can be about 3, the connection holes 34 can be formed in the first mask layer 31 composed of the 50 nm-thick SiN film with a margin.

The formation of the connection hole pattern 34 in the organic sacrificing layer 30 was carried out by use of an ordinary high-density plasma etching apparatus with ammonia ($NH_3$) as an etching gas. The RF power was 150 W, and the substrate temperature was 20° C. Since the etching rate of the resist film 43 under these etching conditions is roughly equal to that of the organic sacrificing layer 30, the resist mask 43 gradually retreats during the etching of the organic sacrificing layer 30; in this case, due to the presence of the second mask layer 32 or the first mask layer 31 of the laminate hard mask, good opening shape of the connection hole pattern 34 can be obtained. By the way, the etching selectivity ratio to the SiN film, the SiO$_2$ film and the SiOC film under the etching conditions of the organic sacrificing layer 30 can be 100 or more, the connection hole pattern 34 in the organic sacrificing layer 30 formed through this step can be disposed self-aligningly relative to the wiring groove pattern 33.

Next, as shown in FIG. 3D, by using as an etching mask the second mask layer 32 [see FIG. 3C] provided with the wiring groove pattern 33, a dry etching process is conducted to form the wiring groove pattern 33 extendingly into the SiN film of the first mask layer 31. This etching is carried out by use of an etching apparatus of the general magnetron system, with difluoromethane (CH$_2$F$_2$), oxygen (O$_2$) and argon (Ar) as an etching gas, a gas flow rate ratio (CH$_2$F$_2$:O$_2$:Ar) of 2:1:5, and a bias power of 100 W. Since the selectivity ratio (SiN/SiO$_2$) to the SiO$_2$ film under these etching conditions can be about 3, the pattern in the first mask layer 31 with a thickness of 50 nm can be formed with a margin if the SiO$_2$ film of the second mask layer 32 has a thickness of about 25 nm, for example.

In addition, since the etching selectivity ratio (SiN/SiOC) to the SiOC film under the above-mentioned etching conditions is about 1 (one), in the case of etching the first mask layer 31 composed of the 50 nm-thick SiN film, the connection holes 35 are formed in the protective film 21 composed of the SiOC film to a depth of 80 nm, inclusive of the required over-etching amount. Therefore, it is necessary to achieve complete opening by changing the film thicknesses of the second mask layer 32 and the first mask layer 31 constituting the hard mask, or to add an etching of complete opening in the protective film 21 by use of the first mask 31. In this embodiment, as the additional etching, complete opening in the protective film 21 was carried out by use of an etching apparatus of the general magnetron system, with octafluorocyclopentene (C$_5$F$_8$), carbon monoxide (CO), argon (Ar) and oxygen (O$_2$) as an etching gas, a gas flow rate ratio (C$_5$F$_8$:CO:Ar:O$_2$) of 1:10:5:1, a bias power 1600 W, and a substrate temperature of 20° C. In addition, the formation of the connection holes 35 in the organic film 20 and the formation of the wiring groove pattern 33 in the organic sacrificing layer 30 were carried out by anisotropic etching by use of a high-density plasma etching apparatus with ammonia (NH$_3$) gas, in the same manner as in the case of forming the connection holes 35 in the organic sacrificing layer 30.

Next, as shown in FIG. 3E, the connection holes 35 are formed in the first insulation film 18 composed of the SiOC film. Here, the protective film 21 composed of the SiOC film remaining in the wiring groove regions is simultaneously removed by using as an etching mask the first mask layer 31 composed of the SiN film and the organic sacrificing layer 30 which have been provided with the wiring groove pattern 33, with the result that the wiring grooves 36 are formed. This etching is carried out, for example, by use of an etching apparatus of the general magnetron system, with octafluorocyclopentene (C$_5$F$_8$), carbon monoxide (CO), argon (Ar) and oxygen (O$_2$) as an etching gas, a gas flow rate ratio (C$_5$F$_8$:CO:Ar:O$_2$) of 1:10:5:5, a bias power of 1600 W, and a substrate temperature of 20° C. Here, while etching conditions for good selective removal property was set for forming the wiring grooves 36 to be wide opening portions in the protective film 21, the wiring grooves 36 and the connection holes 35 with shapes controlled for very little corner collapse could be formed, due to the presence of the thick organic sacrificing layer 30 under the first mask layer 31. In addition, by the formation of the self-aligning connection holes through the use of the resist mask 43 with the size-regulated opening portions 44 and the second mask layer 32 composed of the SiO$_2$ film, the dispersion of the inter-wiring space due to misalignment can be suppressed drastically.

Figure 3F:
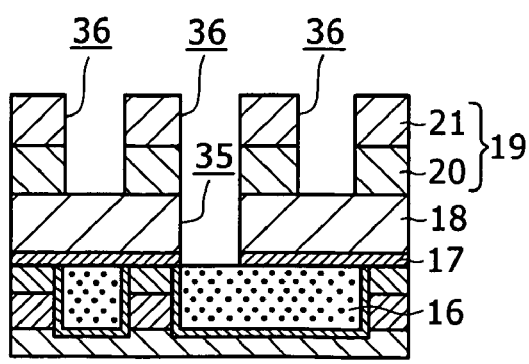

Thereafter, as shown in FIG. 3F, the organic film 20 of the second insulation film 19 remaining in bottom portions of the wiring grooves 36 was etched to complete the wiring grooves 36, and the SiC film of the oxidation inhibitive layer 17 present at bottom portions of the connection holes 35 is etched to form the connection holes 35 further extendingly. By this, the connection holes 35 reach the first wiring 16. In this manner, the so-called dual Damascene processing is completed. Incidentally, the first mask layer 31 composed of the SiN film is removed during the process of etching the SiOC film of the first insulation film 18 present at the bottom portions of the connection holes 35. In addition, the organic sacrificing layer 30 remaining outside the regions of the wiring grooves 36 is removed during the process of etching the organic film 20 composed of the polyaryl ether film of the second insulation film 19. Besides, due to the presence of the protective film 21 composed of the SiOC film on the organic film 20, the surface of the organic film 20 would not be etched even if the organic sacrificing layer 30 is etched at the time of forming the wiring grooves 36 in the organic film 20.

The formation of the wiring grooves 36 in the organic film 20 of the second insulation film 19 was carried out by use of an ordinary high-density plasma etching apparatus, with ammonia (NH$_3$), for example, as an etching gas. The RF power was 150 W, and the substrate temperature was 20° C. Since the etching selectivity ratio to the SiOC film of the first insulation film 18 under these etching conditions can be 100 or more, the wiring grooves 36 can be formed without dispersion of depth and with good controllability.

The etching of the SiC film of the oxidation inhibitive layer 17 present at bottom portions of the connection holes 35 is carried out by use of an etching apparatus of the general magnetron system, with difluoromethane (CH$_2$F$_2$), oxygen (O$_2$) and argon (Ar) as an etching gas, a gas flow rate ratio (CH$_2$F$_2$:O$_2$:Ar) of 2:1:5, and a bias power of 100 W. It should be noted here that since the selectivity ratio to the SiOC film under the above-mentioned etching conditions is around 1 (one), in the case where the etching (digging) of the SiOC film at the bottom portions of the wiring grooves 36 is a problem, the SiC film of the oxidation inhibitive layer 17 may be conducted before the formation of the wiring grooves 36 in the organic film 20 of the second insulation film 19. In addition, the SiN film of the second mask layer 32 remaining at upper portions of the inter-layer films (the first and second insulation films 18 and 19) can be completely removed during the etching of the SiC film of the oxidation inhibitive layer 17.

Figure 4A:
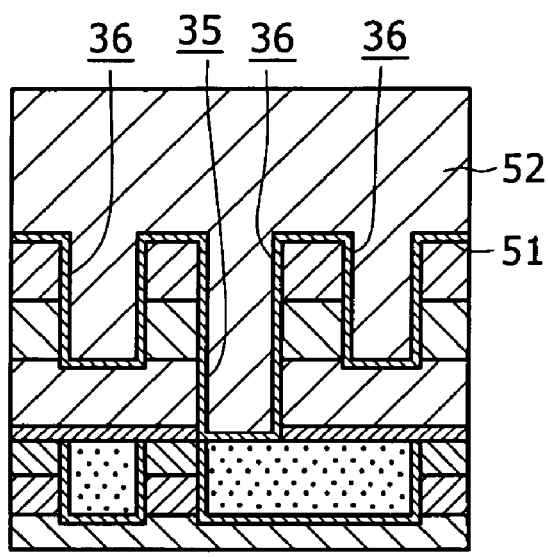
FIGS. 4A and 4B are schematic sectional views showing the second embodiment of the method of manufacturing a semiconductor device according to the present invention.

Next, etching deposits remaining on the side walls of the wiring grooves 36 and the connection holes 35 and a denatured Cu layer present at bottom portions of the connection holes are cleaned away by an after-treatment using an appropriate liquid chemical and a hydrogen annealing treatment. Thereafter, as shown in FIG. 4A, a Ta film as a barrier metal layer 51, for example, is formed on the inside surfaces of the wiring grooves 36 and the connection holes 35; further, though not shown, a copper seed layer is formed and then a copper film 52 is deposited by an electroplating process, or, alternatively, the copper film 52 is deposited by a sputtering process. By this, the wiring grooves 36 and the connection holes 35 can be filled (buried) with copper while forming a conductor film.

Figure 4B:
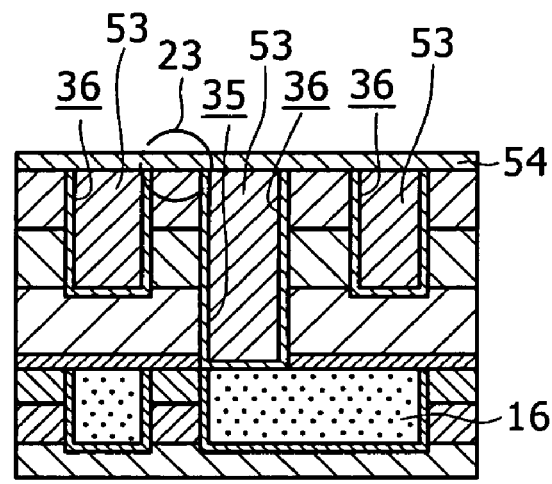

Furthermore, of the copper film 52 and the barrier metal layer 51 thus deposited, the portions not necessary as the second wiring are removed by a chemical mechanical polishing (CMP) process, to complete the second wiring 53 in the wiring grooves 36, as shown in FIG. 4B, and parts thereof are connected to the first wiring 16 through the connection holes 35. By this, a multi-layer wiring structure of the so-called dual Damascene structure is obtained. The film thickness of the second wiring 53 constituting the upper layer wiring finally was regulated to about 170 nm, for example. In addition, an oxidation inhibitive layer 54 covering the second wiring 53 is formed by use of an SiC film, for example, in the same manner as for the first wiring 16 constituting the lower layer wiring.

In the multi-layer wiring of the so-called dual Damascene structure formed through the manufacturing steps in the second embodiment described above, the formation of the wiring grooves 36 by use of the first and second mask layers 32 and 23 inclusive of the organic sacrificing layer 30 and the formation of the self-aligning connection holes 35 are combined with each other, whereby the separation spaces between the wiring grooves 36 and the connection holes 35 can be sufficiently secured with very small dispersions, so that prevention of shortcircuit with the adjacent different-potential wiring and securing of a withstand voltage can be achieved. For example, the regions 23 between the wirings 53 and 53 can be maintained at such a sufficient interval that shortcircuits between the wirings would not occur and that a withstand voltage is secured. Therefore, the semiconductor device produced through the multi-layer wiring process including at least the above-mentioned steps could be obtained with high yield and good wiring reliability.

Incidentally, each of the interlayer insulation films described above is not limited to the kind of film, film thickness and manufacturing method described above. The oxidation inhibitive layers 17 and 54 of Cu films may be replaced by SiN films formed by a CVD process, and SiC films containing a light element such as nitrogen (N) and hydrogen (H) can also be used therefor.

In place of the SiOC film of the first insulation film 18 to be an inter-layer film for formation of the connection holes 35 and the SiOC film to be the protective film 21 for the organic film 20 composed of the polyaryl ether to be the inter-layer film to be provided with the wiring grooves 36, there may be used an SiOF film or SiO$_2$ film formed by a CVD process, or a methylsilsesquioxane (MSQ) or hydrogensilsesquioxane (HSQ) formed by a spin coating process. In place of the organic film 20 composed of the polyaryl ether, there may be applied a polyether film, an amorphous carbon film, or a polytetrafluoroethylene film. Further, a xerogel film, an MSQ film or organic polymer having a porous structure and a dielectric constant of not more than 2.2, or a combination thereof may also be applied.

Besides, while the organic sacrificing film 30, the first mask layer 31 and the second mask layer 32 were composed respectively of the polyaryl ether film (150 nm), the SiN film (50 nm) and the SiO$_2$ film (35 nm) in this order from the lower side, they are not limited to the above-mentioned details inasmuch as the kinds of films, film thicknesses and production methods are in such a combination that a lower layer mask can be etched by use of an upper layer mask and the structure is such that the close contact property and thermal resistance upon lamination can endure the subsequent etching steps. For example, the SiN film of the first mask layer 31 may be replaced by an SiC film or SiCN film formed by a CVD process, and the film can be thinned as long as the etching selectivity ratio allows. Similarly, the second mask layer 32 as the uppermost layer may be composed of an amorphous silicon film formed by a sputtering process. Furthermore, a resist material such as a novolak based resin may be applied to form the organic sacrificing layer 30, the CVD films of the first and second mask layers 32 and 23 may be formed at a low temperature of 200 to 350° C., and the first and second mask layers 32 and 23 themselves may be formed by use of coating type materials.

The size of the connection hole pattern 34 may not necessarily be limited to that in this embodiment; however, when the size of the connection hole pattern 34 is too small, a reduction in the size of the connection hole pattern 34 due to misalignment and the attendant variations in characteristics such as filling-with-copper characteristic and reliability deterioration would result. When the size of the connection hole pattern 34 is too large, size controllability of the dense connection hole pattern 34 would be degraded. Therefore, the size of the connection hole pattern 34 is desirably set so that these problems can be obviated. The connection holes 35 disposed at wide wiring portions have a larger opening size as compared to the connection holes at minimum size wiring portions, and, particularly in the case where the securing of the separation space for separation from the lower layer adjacent wiring becomes a problem, it is necessary to set layout rules such as restriction of the space between the connection hole and the different-potential lower layer wiring according to the upper layer wiring width.

The SiOC film to be the protective film 21 for the organic film 20 of the second insulation film 19 is finally left (for example, left in a thickness of 50 nm) as the insulation film between the wiring layers in this embodiment. However, the SiOC film may be removed in the CMP step for copper, if the close contact with the barrier metal, the mechanical strength in the copper CMP step or the damage upon a reducing treatment of the copper oxide carried out before the formation of the oxidation inhibitive layer 54 of copper does not constitute a problem.

In the manufacturing method according to the second embodiment described above, the same functions or effects as those of the first embodiment can be obtained. Simultaneously, by forming the etching mask structure of the first and second mask layers 32 and 23 inclusive of the organic sacrificing layer 30, the corner collapse shape of the wiring grooves 36 was further improved, miniaturization on the order of half-pitch≦60 nm for the 32 nm generation and the latter generations was achieved, the requirement for a lowering in dielectric constant to a value of 2.2 or below was met, and prevention of shortcircuits between the wiring grooves 36 and the connection holes 35 and securing of a withstand voltage were realized.

[Third Embodiment]

A third embodiment of the method of manufacturing a semiconductor device according to the present invention will be described referring to manufacturing step sectional views shown in FIGS. 5A to 5F and FIGS. 6A and 6B. While the manufacturing method in the so-called hybrid low dielectric constant film structure in which an organic film (for example, a polyaryl ether film) is sandwiched between the wiring layers has been described in the embodiments 1 and 2 above, the present invention is applicable also to the cases of other low dielectric constant film structures. Here, an example of application to a low dielectric constant film structure based primarily on an SiOC film will be described.

Figure 5A:
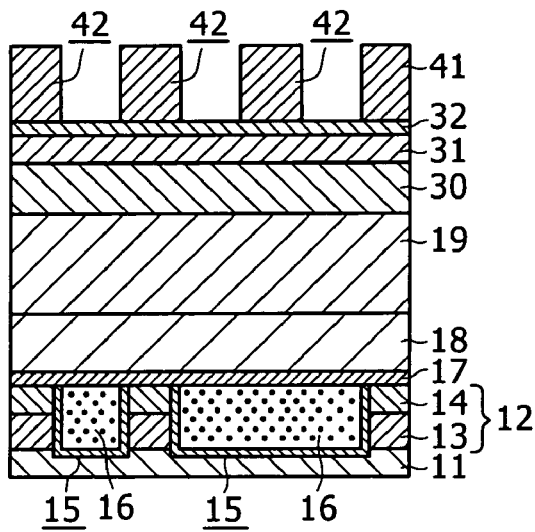
FIGS. 5A to 5F are schematic sectional views showing a third embodiment of the method of manufacturing a semiconductor device according to the present invention.

As shown in FIG. 5A, an interlayer insulation film 12 is formed on an under insulation film 11 deposited on a substrate (not shown). The interlayer insulation film 12 is formed, for example, by forming a laminate film composed of an organic film 13 and a silicon oxide ($SiO_2$) film 14. A first wiring 16 is formed in wiring grooves 15 in the interlayer insulation film 12, with a close contact layer, a barrier metal layer or the like therebetween. The first wiring 16 is formed to have a wiring thickness of about 150 nm by burying a copper (Cu) film, for example. In addition, an oxidation inhibitive layer 17 is formed on the first wiring 16. The oxidation inhibitive layer 17 is formed, for example, by forming a silicon carbide (SiC) film in a thickness of 35 nm.

Subsequently, a first insulation film 18 between connection hole layers is formed. As the first insulation film 18, a carbon-containing silicon oxide (SiOC) film was formed in a thickness of 135 nm. The formation of the SiC film and the SiOC film was carried out by use of a parallel flat plate type plasma CVD apparatus, as an example, with methylsilane as a silicon source in both cases. The film forming conditions are a substrate temperature of 300 to 400° C., a plasma power of 150 to 350 W, and a film forming atmosphere pressure of about 100 to 1000 Pa. The SiC film and the SiOC film could be formed to have dielectric constants of about 3.8 and about 2.6, respectively.

Next, a second insulation film 19 is formed on the first insulation film 18. As the second insulation film 19, an SiOC film is formed. In this embodiment, like in the case of the SiOC film of the first insulation film 18, the SiOC film was formed by use of a CVD apparatus, in a thickness of 255 nm under such conditions as to promise a dielectric constant of about 3.0. In forming the SiOC film, particularly in the case where the so-called selective removal property in the etching in the subsequent step will be a problem, it is desirable to form an SiOC film richer in oxygen than stoichiometry.

Subsequently, an organic sacrificing layer 30, a first mask layer 31 and a second mask layer 32 are sequentially formed on the second insulation film 19. As one example, the organic sacrificing layer 30 was composed of a polyaryl ether film having a thickness of 150 nm, for example. Other than the polyaryl ether, there can be applied a BCB film, a polyimide film, an amorphous carbon film, or a resist film of a highly heat-resistant novolak resin or the like, to form the organic sacrificing layer 30. The film thickness of the organic sacrificing layer 30 is not limited to 150 nm, inasmuch as the layer is applicable as an etching mask in the subsequent step and can be etched by using as a mask the first and second mask layers which are upper layer hard masks. The first mask layer 31 was composed of a silicon nitride (SiN) film having a thickness of 50 nm. Further, the second mask layer 32 was composed of an $SiO_2$ film having a thickness of 35 nm. Thereafter, a resist mask 41 for the formation of wiring grooves is formed on the second mask layer 32. The resist mask 41 is provided with opening portions 42 for forming a wiring groove pattern.

The $SiO_2$ film constituting the second mask layer 32 can be formed by a plasma CVD process, with monosilane ($SiH_4$) as a silicon source (raw material gas), and dinitrogen monoxide ($N_2O$) gas as an oxidant. In forming the $SiO_2$ film to be the first mask layer 31, particularly in the case where the oxidation of the organic sacrificing layer 30 composed of the lower layer polyaryl ether film will be a problem, it is desirable to form a silicon oxide film richer in silicon than stoichiometry. In addition, the SiN film to be the first mask layer 31 can be formed by use of the same plasma CVD apparatus as that for the $SiO_2$ film, with monosilane ($SiH_4$) as a silicon source (raw material gas), ammonia ($NH_3$) gas as a nitriding agent, dinitrogen monoxide ($N_2O$) gas as an oxidant, and an inert gas as a carrier gas.

Figure 5D:
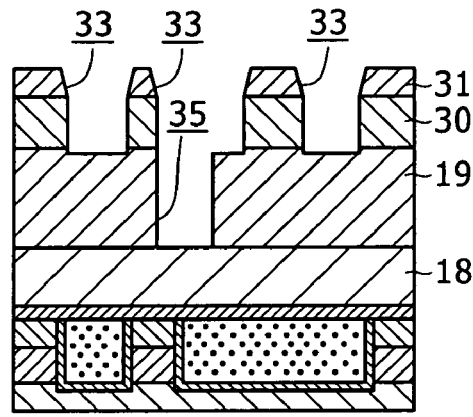
Figure 5B:
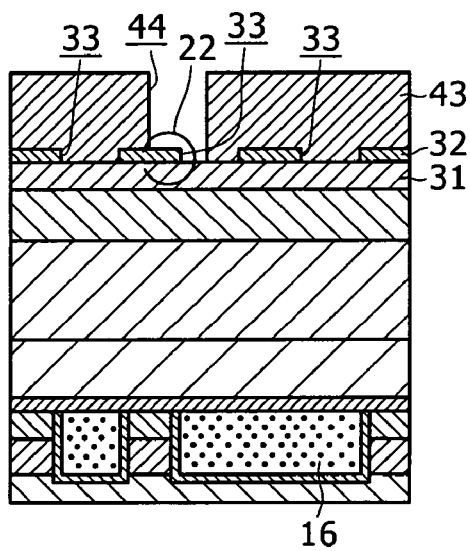

Next, as shown in FIG. 5B, by use of the resist mask 41 [see FIG. 5A] as an etching mask, dry etching is conducted to form a wiring groove pattern 33 in the second mask layer 32. This etching is carried out by use of an etching apparatus of the general magnetron system, with an octafluorobutane ($C_4F_8$), carbon monoxide (CO) and argon (Ar) as an etching gas, a gas flow rate ratio ($C_4F_8$:CO:Ar) of 1:5:20, a bias power of 1200 W, and a substrate temperature of 20° C. Since the etching selectivity ratio ($SiO_2$/SiN) to the SiN film under these etching conditions can be 10 or more, the SiN film constituting the first mask layer 31 serving as an under layer is little dug. After the etching of the second mask layer 32, an ashing treatment based on an oxygen ($O_2$) plasma, for example, and a treatment with an organic amine-based liquid chemical are carried out, whereby the resist mask 41 and deposits left upon the etching treatment can be completely removed.

Next, a resist mask 43 for forming a connection hole pattern is formed. The resist mask 43 is provided with opening portions 44 for the formation of connection holes. Besides, the resist mask 43 is so formed as to at least partly overlap with the wiring groove pattern 33 in the second mask layer 32. Since steps generated at the wiring groove pattern 33 in the second mask layer 32 can be suppressed to about 35 nm which corresponds generally to the film thickness of the second mask layer 32, a good resist mask shape of the connection holes can be obtained with substantially the same lithography characteristics as in the case of patterning a flat portion. In addition, even in the case of using a coating type anti-reflection film (for example, BARC) together, variations in the burying shape of the anti-reflection film are suppressed to a faint level, according to the size and the degree of denseness of the second mask layer 32, so that worsening of the resist shape at the time of a light exposure treatment and dispersion of focal depth which would cause size variations can be reduced.

The resist mask 43 for forming the connection holes is so formed as to be aligned to the first wiring 16 or the wiring groove pattern 33, and, due to the misalignment which may be generated on a lithography process basis and the size dispersion of each layer, regions 22 with a borderless structure relative to the wiring groove pattern 33 are generated.

Figure 5E:
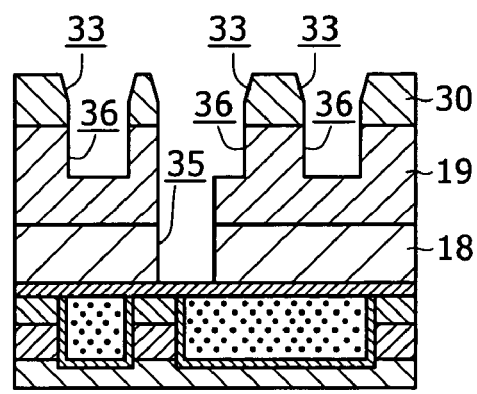
Figure 5C:
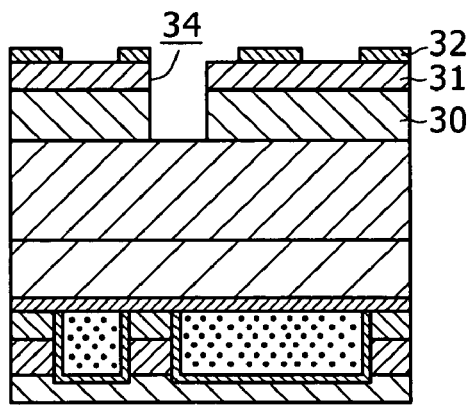

Next, as shown in FIG. 5C, by use of the resist mask 43 [see FIG. 5B] for forming a connection hole pattern as an etching mask, a dry etching process is carried out to form the connection hole pattern 34 in the second mask layer 32 and the first mask layer 31. Further, the connection hole pattern 34 is formed extendedly into the organic sacrificing layer 30. Here, the resist mask 43 can be simultaneously removed by the etching treatment of the organic sacrificing layer 30.

The formation of the connection hole pattern 34 in the range to the laminate hard mask is carried out by use of an etching apparatus of the general magnetron system, with octafluorobutane ($C_4F_8$) and argon (Ar) as an etching gas, and a bias power of 400 W. The gas flow rate ratio ($C_4F_8$:Ar) was 1:4, and the substrate temperature was 20° C. The etching selectivity ratio ($SiO_2$/SiN) under the etching conditions is about 1 (one), so that the connection hole pattern 34 can be formed in the laminate mask in one step; however, where the resist selectivity ratio, the etching conversion difference or the like constitutes a problem, the objective mask material can sequentially be removed selectively in relation to the insulation film serving as an under layer.

The formation of the connection hole pattern 34 in the organic sacrificing layer 30 was carried out by use of an ordinary high-density plasma etching apparatus, with ammonia ($NH_3$) as an etching gas. The RF power was 150 W, and the substrate temperature was 20° C. Since the etching rate of the resist film 43 under these etching conditions is roughly equal to that of the organic sacrificing layer 30, the resist mask 43 gradually retreats during the etching of the organic sacrificing layer 30; however, due to the presence of the second mask layer 32 or the first mask layer 31 of the laminate hard mask, a good opening shape of the connection hole pattern 34 can be obtained. By the way, the etching ratio to the SiN film, the $SiO_2$ film and the SiOC film under the etching conditions for the organic sacrificing layer 30 can be 100 or more.

Next, as shown in FIG. 5D, by use of the second mask layer 32 [see FIG. 5C] provided with the wiring groove pattern 33 as an etching mask, a dry etching process is conducted to form the wiring groove pattern 33 extendingly into the SiN film of the first mask layer 31. Simultaneously, the connection holes 35 are formed up to an intermediate portion of the second insulation film 19 composed of the SiOC film. Further, the wiring groove pattern 33 is formed extendingly into the organic sacrificing layer 30. This etching is conducted by use of an etching apparatus of the general magnetron system, with difluoromethane ($CH_2F_2$), oxygen ($O_2$) and argon (Ar) as an etching gas, a gas flow rate ratio ($CH_2F_2:O_2:Ar$) of 2:1:5, and a bias power of 100 W. Since the selectivity ratio (SiN/$SiO_2$) to the $SiO_2$ film under these etching conditions can be about 3, the etching in the first mask layer 31 with a thickness of 50 nm can be performed with a margin, if the $SiO_2$ film of the second mask layer 32 is present in a thickness of about 25 nm, for example.

In addition, since the etching selectivity ratio (SiN/SiOC) to the SiOC film under the above-mentioned etching conditions is about 1 (one), the formation of the connection holes 35 in the second insulation film 19 composed of the SiOC film between the wiring layers results in intermediate opening to the depth of about 80 nm. In view of this, in the subsequent formation of the wiring grooves 36 in the second insulation film 19, it is necessary that the depth of the connection holes 35 reach the remaining film so that the connection holes 35 can penetrate through the first insulation film 18 composed of the SiOC film. Therefore, by etching using the first mask layer 31 composed of the SiN film, additional etching of the connection holes 35 was conducted until the connection holes 35 penetrated through the second insulation film 19. In this embodiment, as the additional etching, the connection holes 35 were extendedly formed in the second insulation film 19 by use of an etching apparatus of the general magnetron system, with octafluorocyclopentene ($C_5F_8$), carbon monoxide (CO), argon (Ar) and oxygen ($O_2$) as an etching gas, a gas flow rate ratio ($C_5F_8:CO:Ar:O_2$) of 1:10:5:1, a bias power of 1600 W, and a substrate temperature of 20° C.

Next, as shown in FIG. 5E, the connection holes 35 are formed in the first insulation film 18 composed of the SiOC film. In this instance, the second insulation film 19 composed of most SiOC film remaining in the wiring groove regions is removed simultaneously with the first insulation film 18 provided with the connection holes 35, by using as an etching mask the first mask layer 31 composed of the SiN film and the organic sacrificing layer 30 which have been provided with the wiring groove pattern 33, whereby wiring grooves 36 are formed. This etching is carried out, for example, by an etching apparatus of the general magnetron system, with octafluorocyclopentene ($C_5F_8$), carbon monoxide (CO), argon (Ar) and oxygen ($O_2$) as an etching gas, a gas flow rate ratio ($C_5F_8:CO:Ar:O_2$) of 1:10:5:5, a bias power of 1600 W, and a substrate temperature of 20° C. Here, etching conditions promising good selective removal property were set, for forming the wiring grooves 36 to be wide opening portions in the second insulation film 19; however, due to the presence of the thick organic sacrificing layer 30 beneath the first mask layer 31, the wiring grooves 36 and the connection holes 35 controlled to the shapes with very little corner collapse could be formed.

Figure 5F:
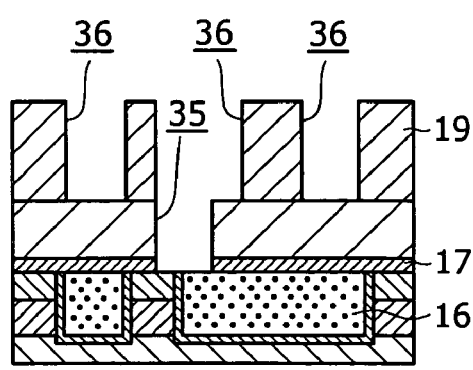

Thereafter, as shown in FIG. 5F, the SiOC film of the second insulation film 19 remaining in bottom portions of the wiring grooves 36 is etched to complete the wiring grooves 36, and the SiC film of the oxidation inhibitive layer 17 present at bottom portions of the connection holes 35 is etched to form the connection holes 35 further extendingly. As a result, the connection holes 35 reach the first wiring 16. In this manner, the predetermined so-called dual Damascene processing is completed.

The etching of the SiC film of the oxidation inhibitive layer 17 present at bottom portions of the connection holes 35 is carried out by an etching apparatus of the general magnetron system, with difluoromethane ($CH_2F_2$), oxygen ($O_2$) and argon (Ar) as an etching gas, a gas flow rate ratio ($CH_2F_2:O_2:Ar$) of 2:1:5, and a bias power of 100 W. Since the selectivity ratio to the SiOC film under the above-mentioned etching conditions is around 1 (one), this etching permits the wiring grooves 36 to reach the planned wiring groove depth. It should be noted, however, that etching of the wiring grooves selectively relative to the portion between the connection hole layers cannot be expected, on the basis of the low dielectric constant film structure. Therefore, it is necessary to design a process which allows, to a certain extent, the dispersions of the etching depth and the connection hole shape. In addition, the removal of the organic sacrificing layer 30 was conducted by use of an ordinary high-density plasma etching apparatus, with ammonia ($NH_3$), for example, as an etching gas. The RF power was 150 W, and the substrate temperature was 20° C. The etching selectivity ratio to the SiOC film under these etching conditions can be 100 or more. Therefore, the shapes of the wiring grooves 36 and the connection holes 35 formed in the second insulation film 19 would not be degraded.

Figure 6A:
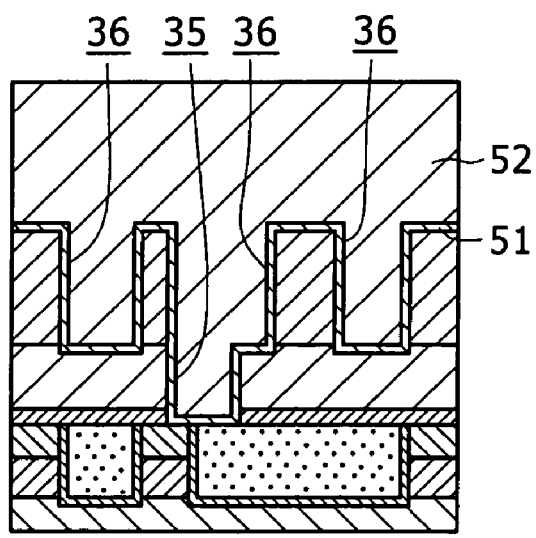
FIGS. 6A and 6B are schematic sectional views showing the third embodiment of the method of manufacturing a semiconductor device according to the present invention.

Next, an after-treatment using an appropriate liquid chemical and a hydrogen annealing treatment are conducted, to clean away the etching deposits remaining on the side walls of the wiring grooves and the connection holes as well as a denatured Cu layer present at bottom portions of the connection holes. Thereafter, as shown in FIG. 6A, a Ta film as a barrier metal layer 51, for example, is formed on the inside surfaces of the wiring grooves 36 and the connection holes 35 by a sputtering process, and, further, though not shown, a copper seed layer is formed and then a copper film 52 is deposited by an electroplating process, or the copper film 52 is deposited by a sputtering process. By this, the wiring grooves 36 and the connection holes 35 can be filled (buried) with copper while forming a conductor film. As the conductor film, other metallic materials than copper may also be used.

Figure 6B:
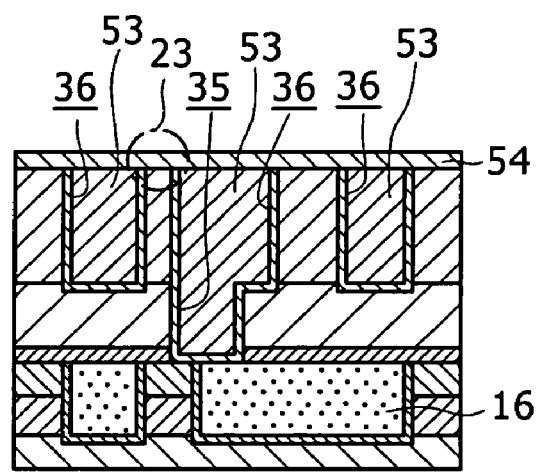

Further, of the copper film 52 and the barrier metal layer 51 deposited, the portions not necessary as the second wiring are removed by a chemical mechanical polishing (CMP) process, to complete the second wiring 53 in the wiring grooves 36 as shown in FIG. 6B, and parts thereof are connected to the first wiring 16 through the connection holes

35. By this, a multi-layer wiring structure of the so-called dual Damascene structure is obtained. The film thickness of the second wiring 53 to be a final upper layer wiring was regulated to about 170 nm, for example. Besides, similarly to the case of the first wiring 16 serving as the lower layer wiring, an oxidation inhibitive layer 54 covering the second wiring 53 is formed by use of an SiC film, for example.

In the multi-layer wiring of the so-called dual Damascene structure formed through the manufacturing steps of the third embodiment described above, the formation of the wiring grooves 36 by use of the laminated first mask layer 31 and second mask layer 32 including the organic sacrificing layer 30 is conducted, whereby the wiring grooves 36 and the connection holes 35 with corner collapse suppressed can be formed. Therefore, prevention of shortcircuits with the adjacent different-potential wiring and securing of a withstand voltage can be achieved. For example, the regions 23 between the wirings 53 and 53 can be maintained at such a sufficient interval that inter-wiring shortcircuit would not occur and that a withstand voltage is secured. Therefore, the semiconductor device manufactured through the multi-layer wiring process including at least the above-mentioned steps can be obtained in high yield.

Incidentally, each of the various interlayer insulation films described above is not limited to the kind of film, film thickness and manufacturing method mentioned above. The oxidation inhibitive layers 17 and 54 for Cu films may be SiN films formed by a CVD process, and SiC films containing a light element such as nitrogen (N) and hydrogen (H) may also be used.

The laminate structure of the SiOC film of the first insulation film 18 to be an inter-layer film provided with the connection holes 35 and the SiOC film of the second insulation film 19 to be an inter-layer film provided with the wiring grooves 36 may be produced by use of a single SiOC film, and the dielectric constant is not limited to the value of 2.6 or 3.0, so long as there is no problem as to etching performance, CMP endurance or wiring reliability. In addition, a different SiOC film may be adopted for only the protective film polished by CMP. Similarly, an SiOF film or $SiO_2$ film formed by a CVD process or a methylsilsesquioxane (MSQ) film or hydrogensilsesquioxane (HSQ) film formed by a spin coating process may be adopted in place of the SiOC film, and, further, an MSQ film having a porous structure and a dielectric constant of not more than 2.2 or a combination of these films may also be used.

In addition, while the organic sacrificing layer 30, the first mask layer 31 and the second mask layer 32 were composed respectively of the polyaryl ether film (150 nm), the SiN film (50 nm) and the $SiO_2$ film (35 nm) in this order from the lower side, which represent the kinds of films, film thicknesses and manufacturing methods in such a combination that a lower layer mask can be etched by use of an upper layer mask, the structure is not limited to the details of the above description, inasmuch as the structure ensures that the close contact property and thermal resistance property after lamination can endure the subsequent etching steps. For example, the SiN film of the first mask layer 31 may be an SiC film or SiCN film formed by a CVD process, and can be thinned inasmuch as the etching selectivity ratio permits. Similarly, the second mask layer 32 serving as the uppermost layer may be an amorphous silicon film formed by a sputtering process. Further, the organic sacrificing layer 30 may be formed by applying a resist material such as a novolak resin, the CVD films of the first and second mask layers 31 and 32 may be formed at a low temperature of 200 to 350° C., and the first and second mask layers 31 and 32 themselves may be composed of coating type materials.

In the manufacturing method described in the third embodiment, the organic sacrificing layer 30, the first mask layer 31 and the second mask layer 32 are sequentially formed on the second insulation film 19, i.e., the organic sacrificing layer 30 is provided between the second insulation film 19 and the first mask layer 31, so that the formation of the wiring grooves 36 in the second insulation film 19 composed of the $SiO_2$ film which has had difficulty in controlling the processed shape in the related-art method can be easily carried out, and it is possible to realize the formation of a multi-layer wiring with low capacity and high performance without being affected by the material of the low dielectric constant film applied to form the second insulation film 19. Therefore, the dual Damascene processing with little corner collapse and with processing conversion difference controlled can be easily performed, in forming a multi-layer wiring of the dual Damascene structure in the interlayer insulation films including a low dielectric constant film.

In short, by forming the organic sacrificing layer 30 on the second insulation film 19 and forming the first mask layer 31 thereon, the mask shape in the first mask layer 31 can be transferred to the organic sacrificing layer 30. Therefore, even when the first mask layer 31 is removed during the manufacturing process and the shapes on the opening side of the wiring groove pattern 33 and the connection hole pattern 34 formed in the organic sacrificing layer 30 are tapered, the shapes of the wiring groove pattern 33 and the connection hole pattern 34 on the second insulation film 19 side of the organic sacrificing layer 30 can be maintained, so that the connection holes 35 and the wiring grooves 36 can be processed in desired shapes in the second insulation film 19. Besides, the organic sacrificing layer 30 is removed after the formation of the connection holes 35 and the wiring grooves 36, so that the formation is not affected by the organic sacrificing layer 30 worsened in its shape on the upper side.

As a result of this, the lowering of product yield due to shortcircuits between wirings can be suppressed or restrained, and the initial defects due to insufficient withstand voltage or deterioration in the wiring reliability concerning inter-wiring TDDB (Time Dependence Dielectric Breakdown) or the like can be suppressed or restrained. In addition, also from the viewpoint of coping with the miniaturization on the order of the 65 nm generation and the latter generation, according to the present invention by which the inter-wiring space can be secured with good controllability, the same effects as above can be expected. Further, by combining the manufacturing method with a manufacturing method including the step of forming the connection holes 35 self-aligning to the wiring grooves 36, it is possible to manufacture a semiconductor device having a sufficient separation margin. Therefore, high yield and good wiring reliability could be obtained.

[Fourth Embodiment]

A fourth embodiment of the method of manufacturing a semiconductor device according to the present invention will be described referring to manufacturing step sectional views shown in FIGS. 7A to 7F and FIGS. 8A and 8B. While in the embodiment 3 the prevention of shortcircuit defects between the wiring and the connection holes and the securing of the withstand voltage were realized by improving the corner collapse shape of the wiring grooves through the laminate etching mask structure including the organic sacrificing layer, in the cases of the 32 nm generation and the latter generations there is a need for miniaturization down to a half-pitch of 60 nm or below and a dielectric constant reduction down to 2.2 or below. In view of this, in the fourth embodiment, based on the manufacturing method in the embodiment 3, one example of a method of manufacturing a multi-layer wiring through a groove wiring structure applicable to the formation of a wiring with a minute pitch will be described below.

Figure 7A:
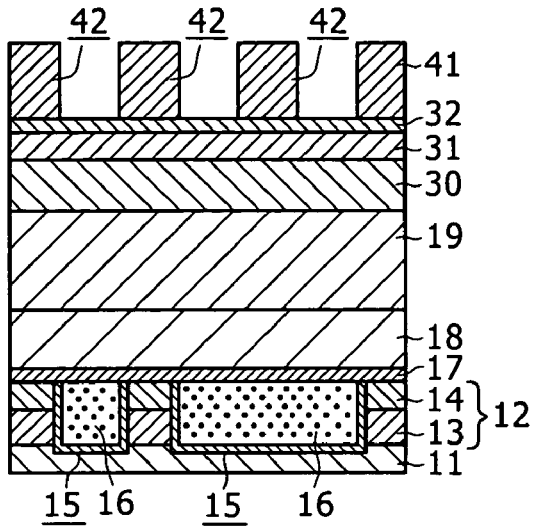
FIGS. 7A to 7F are schematic sectional views showing a fourth embodiment of the method of manufacturing a semiconductor device according to the present invention.

As shown in FIG. 7A, an interlayer insulation film 12 is formed on an under insulation film 11 deposited on a substrate (not shown). The interlayer insulation film 12 is formed, for example, by forming a laminate film composed of an organic film 13 and a silicon oxide ($SiO_2$) film 14. A first wiring 16 is formed in wiring grooves 15 in the interlayer insulation film 12, with a close contact layer, a barrier metal layer or the like therebetween. The first wiring 16 is formed, for example, by burying a copper (Cu) film in a wiring thickness of about 150 nm. In addition, an oxidation inhibitive layer 17 is formed on the first wiring 16. The oxidation inhibitive layer 17 is formed, for example, by forming a silicon carbide (SiC) film in a thickness of 35 nm.

Subsequently, a first insulation film 18 between connection hole layers is formed. As the first insulation film 18, a carbon-containing silicon oxide (SiOC) film was formed in a thickness of 135 nm. The SiC film and the SiOC film were formed by using, as an example, a parallel flat plate type plasma CVD apparatus, with methylsilane as a silicon source (raw material gas) in both cases. The film forming conditions are a substrate temperature of 300 to 400° C., a plasma power of 150 to 300 W, and a film forming atmosphere pressure of about 100 to 1000 Pa. The SiC film and the SiOC film could be formed to have dielectric constants of about 3.8 and about 2.6, respectively.

Next, a second insulation film 19 is formed on the first insulation film 18. As the second insulation film 19, an SiOC film is formed. In this embodiment, like the SiOC film of the first insulation film 18, the SiOC film was formed by use of a CVD apparatus in a thickness of 255 nm under such conditions as to provide a dielectric constant of about 3.0. In forming the SiOC film, particularly in the case where the so-called selective removal property in etching in the subsequent step will be a problem, it is desirable to form an SiOC film richer in oxygen than stoichiometry.

Subsequently, an organic sacrificing layer 30, a first mask layer 31 and a second mask layer 32 are sequentially formed on the second insulation film 19. As one example, the organic sacrificing layer 30 was composed of a polyaryl ether film having a thickness of 150 nm, for example. Other than the polyaryl ether film, there can be used a BCB film, a polyimide film, an amorphous carbon film, or a resist film of a highly heat-resistant novolak resin or the like, for forming the organic sacrificing layer 30. The film thickness of the organic sacrificing layer 30 is not limited to 150 nm, inasmuch as the layer is applicable as an etching mask in the subsequent step and can be etched by using as a mask the first and second mask layers 31 and 32 which are upper layer hard masks. The first mask layer 31 was composed of a silicon nitride (SiN) film having a thickness of 50 nm. Further, the second mask layer 32 was composed of an $SiO_2$ film having a thickness of 35 nm. Thereafter, a resist mask 41 for the formation of wiring grooves is formed on the second mask layer 32. The resist mask 41 is provided with opening portions 42 for forming a wiring groove pattern.

The $SiO_2$ film constituting the second mask layer 32 can be formed by a plasma CVD process using monosilane ($SiH_4$) as a silicon source (raw material gas), and dinitrogen monoxide ($N_2O$) gas as an oxidant. In forming the $SiO_2$ film to be the first mask layer 31, particularly in the case where the oxidation of the organic sacrificing layer 30 composed of the polyaryl ether film serving as an under layer will be a problem, it is desirable to form a silicon oxide film richer in silicon than stoichiometry. In addition, the SiN film to be the first mask layer 31 can be formed by use of the same plasma CVD apparatus as that for the $SiO_2$ film, with monosilane ($SiH_4$) as a silicon source (raw material gas), ammonia ($NH_3$) gas as a nitriding agent, dinitrogen monoxide ($N_2O$) as an oxidant, and an inert gas as a carrier gas.

Figure 7D:
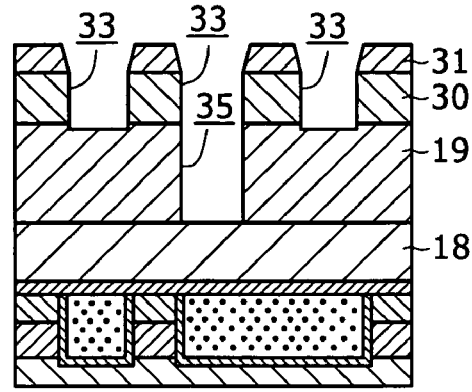
Figure 7B:
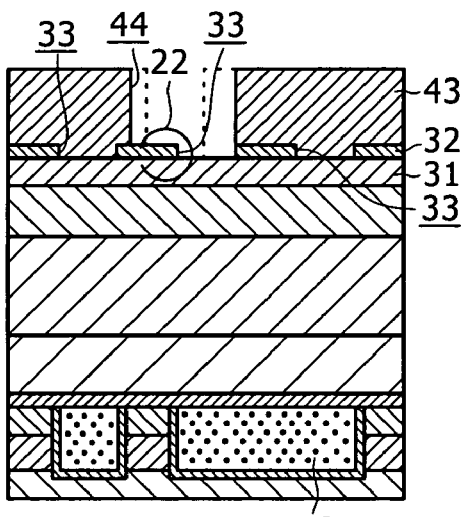

Next, as shown in FIG. 7B, by use of the resist mask 41 [see FIG. 7A] as an etching mask, dry etching is conducted to form a wiring groove pattern 33 in the second mask layer 32. This etching is conducted by use of an etching apparatus of the general magnetron system, with octafluorobutane ($C_4F_8$), carbon monoxide (CO) and argon (Ar) as an etching gas, a gas flow rate ratio ($C_4F_8$:CO:Ar) of 1:5:20, a bias power of 1200 W, and a substrate temperature of 20° C. Since the etching selectivity ratio ($SiO_2$/SiN) to the SiN film under these etching conditions can be 10 or more, the SiN film which is the first mask layer 31 serving as an under layer is little dug. After the etching of the second mask layer 32, an ashing treatment based on an oxygen ($O_2$) plasma, for example, and a treatment with an organic amine-based liquid chemical are conducted, whereby the resist mask 41 and the deposits left upon the etching treatment can be completely removed.

Next, a resist mask 43 for forming a connection hole pattern is formed. The resist mask 43 is provided with opening portions 44 for the formation of connection holes. The opening portions 44 are so formed as to at least partly overlap with the wiring groove pattern 33 in the $SiO_2$ film of the second mask layer 32.

Here, as for the opening portions 44 relative to the wiring groove pattern 33, the diameter of the opening portions 44 is so regulated that a portion of not less than the minimum wiring width will be covered. In the drawing, the portion indicated by broken lines is the range of errors. For example, in the case where it is desired to form connection holes of φ100 nm in relation to the wiring grooves with a half-pitch of 100 nm, if the conversion difference of the minimum wiring size from the wiring groove pattern 33 is about 20 nm and the misalignment is 30 nm at maximum, the wiring groove pattern 33 is set to a size of (wiring minimum line width 100 nm)−(conversion difference 20 nm)+(maximum misalignment 30 nm)×2=140 nm. Besides, where it is desired to form connection holes of φ50 nm in relation to the wiring grooves with a half-pitch of 50 nm, if the conversion difference of the minimum wiring size from the wiring groove pattern 33 is about 15 nm and the misalignment is 20 nm at maximum, the wiring groove pattern 33 is set to a size of (wiring minimum line width 50 nm)−(conversion difference 15 nm)+(maximum misalignment 20 nm)×2=75 nm. In this embodiment, a trial example with the former dimensions is shown.

In addition, steps generated at the wiring groove pattern 33 in the second mask layer 32 are suppressed to about 35 nm which corresponds generally to the film thickness of the second mask layer 32, so that a good resist mask shape of connection holes can be obtained with substantially the same lithography characteristics as in the case of patterning a flat portion. Even where a coating type anti-reflection film (for example, BARC) is used together, variations in the burying shape of the anti-reflection film are suppressed to be faint, according to the size and the degree of denseness of the second mask layer 32, and worsening of the resist shape at the time of a light exposure treatment and dispersion of focal depth which would cause size variations can be reduced.

The resist mask 43 for forming the connection holes is so formed as to be aligned relative to the first wiring 16 or the wiring groove pattern 33, and, due to the misalignment which may be generated on a lithography process basis and the size dispersions of each layer, regions 22 of a borderless structure relative to the wiring groove pattern 33 are generated.

Figure 7E:
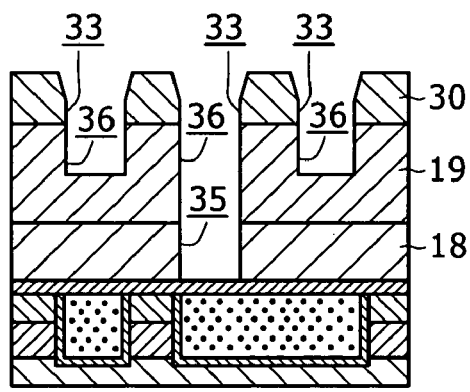
Figure 7C:
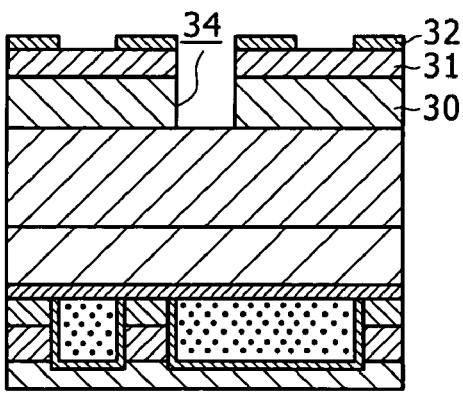

Next, as shown in FIG. 7C, by using as an etching mask the resist mask 43 [see FIG. 7B] for forming a connection hole pattern and the second mask layer 32 of the SiO$_2$ film exposed due to misalignment, a dry etching process is conducted to form a connection hole pattern 34 in the first mask layer 31. Further, the connection hole pattern 34 is formed extendedly into the organic sacrificing layer 30. Here, the resist mask 43 can be simultaneously removed by the etching treatment of the organic sacrificing layer 30.

The formation of the connection hole pattern 34 in the range to the laminate hard mask is carried out by use of an etching apparatus of the general magnetron system, with difluoromethane (CH$_2$F$_2$), oxygen (O$_2$) and argon (Ar) as an etching gas, a gas flow rate ratio (CH$_2$F$_2$:O$_2$:Ar) of 2:1:5, and a bias power of 100 W. Since the etching selectivity ratio (SiN/SiO$_2$) to the SiO$_2$ film under these etching conditions can be about 3, the connection holes 34 can be formed in the first mask layer 31 composed of the 50 nm-thick SiN film with a margin.

The formation of the connection hole pattern 34 in the organic sacrificing layer 30 was carried out by use of an ordinary high-density plasma etching apparatus with ammonia (NH$_3$) as an etching gas. The RF power was 150 W, and the substrate temperature was 20° C. Since the etching rate of the resist film 43 under these etching conditions is roughly equal to that of the organic sacrificing layer 30, the resist mask 43 gradually retreats during the etching of the organic sacrificing layer 30; in this case, due to the presence of the second mask layer 32 or the first mask layer 31 of the laminate hard mask, good opening shape of the connection hole pattern 34 can be obtained. By the way, the etching selectivity ratio to the SiN film, the SiO$_2$ film and the SiOC film under the etching conditions of the organic sacrificing layer 30 can be 100 or more. The connection hole pattern 34 in the organic sacrificing layer 30 formed through this step can be disposed self-alignedly relative to the wiring groove pattern 33.

Next, as shown in FIG. 7D, by using as an etching mask the second mask layer 32 [see FIG. 7C] provided with the wiring groove pattern 33, a dry etching process is conducted to form the wiring groove pattern 33 extendingly into the SiN film of the first mask layer 31. Simultaneously, the connection holes 35 are formed up to an intermediate portion of the second insulation film 19 composed of the SiOC film. Further, the wiring groove pattern 33 is formed extendedly into the organic sacrificing layer 30. This etching is carried out by use of an etching apparatus of the general magnetron system, with difluoromethane (CH$_2$F$_2$), oxygen (O$_2$) and argon (Ar) as an etching gas, a gas flow rate ratio (CH$_2$F$_2$:O$_2$:Ar) of 2:1:5, and a bias power of 100 W. Since the selectivity ratio (SiN/SiO$_2$) to the SiO$_2$ film under these etching conditions can be about 3, the pattern in the first mask layer 31 with a thickness of 50 nm can be formed with a margin if the SiO$_2$ film of the second mask layer 32 has a thickness of about 25 nm, for example.

In addition, since the etching selectivity ratio (SiN/SiOC) to the SiOC film under the above-mentioned etching conditions is about 1 (one), the formation of the connection holes 35 in the second insulation film 19 composed of the SiOC film between the wiring layers results in intermediate opening to a depth of about 80 nm. In view of this, in the subsequent formation of the wiring grooves 36 in the second insulation film 19, it is necessary that the depth of the connection holes 35 reach the remaining film so that the connection holes 35 can penetrate through the first insulation film 18 composed of the SiOC film. Therefore, by etching using the first mask layer 31 composed of the SiN film, additional etching of the connection holes 35 was conducted until the connection holes 35 penetrated through the second insulation film 19. In this embodiment, as the additional etching, the connection holes 35 were extendedly formed in the second insulation film 19 by use of an etching apparatus of the general magnetron system, with octafluorocyclopentene (C$_5$F$_8$), carbon monoxide (CO), argon (Ar) and oxygen (O$_2$) as an etching gas, a gas flow rate ratio (C$_5$F$_8$:CO:Ar:O$_2$) of 1:10:5:1, a bias power of 1600 W, and a substrate temperature of 20° C.

Next, as shown in FIG. 7E, the connection holes 35 are formed in the first insulation film 18 composed of the SiOC film. In this instance, the second insulation film 19 composed of most SiOC film remaining in the wiring groove regions is removed simultaneously with the first insulation film 18 provided with the connection holes 35, by using as an etching mask the first mask layer 31 composed of the SiN film and the organic sacrificing layer 30 which have been provided with the wiring groove pattern 33, whereby wiring grooves 36 are formed. This etching is carried out, for example, by an etching apparatus of the general magnetron system, with octafluorocyclopentene (C$_5$F$_8$), carbon monoxide (CO), argon (Ar) and oxygen (O$_2$) as an etching gas, a gas flow rate ratio (C$_5$F$_8$:CO:Ar:O$_2$) of 1:10:5:5, a bias power of 1600 W, and a substrate temperature of 20° C. Here, etching conditions promising good selective removal property were set, for forming the wiring grooves 36 to be wide opening portions in the second insulation film 19; however, due to the presence of the thick organic sacrificing layer 30 beneath the first mask layer 31, the wiring grooves 36 and the connection holes 35 controlled to the shapes with very little corner collapse could be formed.

Figure 7F:
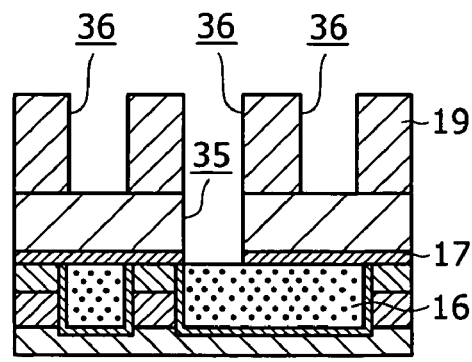

Thereafter, as shown in FIG. 7F, the SiOC film of the second insulation film 19 remaining in bottom portions of the wiring grooves 36 is etched to complete the wiring grooves 36, and the SiC film of the oxidation inhibitive layer 17 present at bottom portions of the connection holes 35 is etched to form the connection holes 35 further extendingly. As a result, the connection holes 35 reach the first wiring 16. Further, the organic sacrificing layer 30 is removed. In this manner, the predetermined so-called dual Damascene processing is completed.

The etching of the SiC film of the oxidation inhibitive layer 17 present at bottom portions of the connection holes 35 is carried out by an etching apparatus of the general magnetron system, with difluoromethane (CH$_2$F$_2$), oxygen (O$_2$) and argon (Ar) as an etching gas, a gas flow rate ratio (CH$_2$F$_2$:O$_2$:Ar) of 2:1:5, and a bias power of 100 W. Since the selectivity ratio to the SiOC film under the above-mentioned etching conditions is around 1 (one), this etching permits the wiring grooves 36 to reach the planned wiring groove depth. It should be noted, however, that etching of the wiring grooves selectively relative to the portion between the connection hole layers can not be expected, on the basis of the low dielectric constant film structure. Therefore, it is necessary to design a process which allows, to a certain extent, the dispersions of the etching depth and the connection hole shape.

In addition, the removal of the organic sacrificing layer 30 was conducted by use of an ordinary high-density plasma etching apparatus, with ammonia ($NH_3$), for example, as an etching gas. The RF power was 150 W, and the substrate temperature was 20° C. The etching selectivity ratio to the SiOC film under these etching conditions can be 100 or more. Therefore, the shapes of the wiring grooves 36 and the connection holes 35 formed in the second insulation film 19 would not be degraded.

Figure 8A:
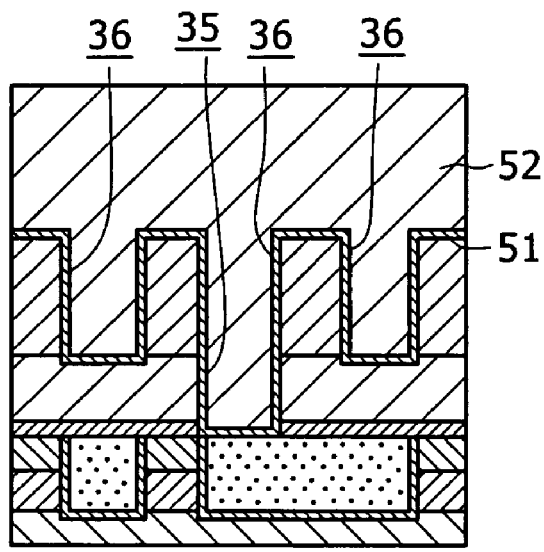
FIGS. 8A and 8B are schematic sectional views showing the fourth embodiment of the method of manufacturing a semiconductor device according to the present invention.

Next, an after-treatment using an appropriate liquid chemical and a hydrogen annealing treatment are conducted, to clean away the etching deposits remaining on the side walls of the wiring grooves 36 and the connection holes 35 as well as a denatured Cu layer present at bottom portions of the connection holes 35. Thereafter, as shown in FIG. 8A, a Ta film as a barrier metal layer 51, for example, is formed on the inside surfaces of the wiring grooves 36 and the connection holes 35 by a sputtering process, and, further, though not shown, a copper seed layer is formed and then a copper film 52 is deposited by an electroplating process, or the copper film 52 is deposited by a sputtering process. By this, the wiring grooves 36 and the connection holes 35 can be filled (buried) with copper while forming a conductor film. As the conductor film, other metallic materials than copper may also be used.

Figure 8B:
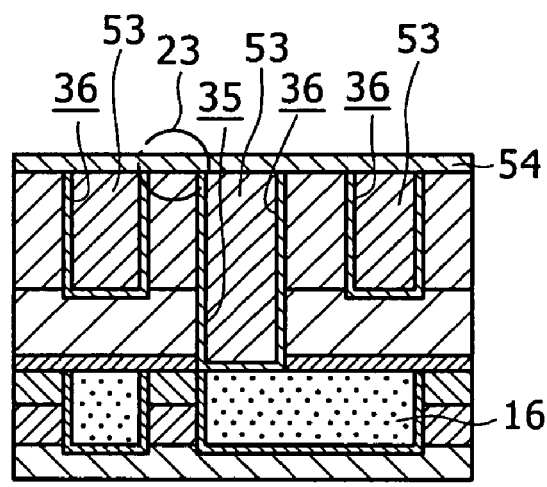
Figure 9A:
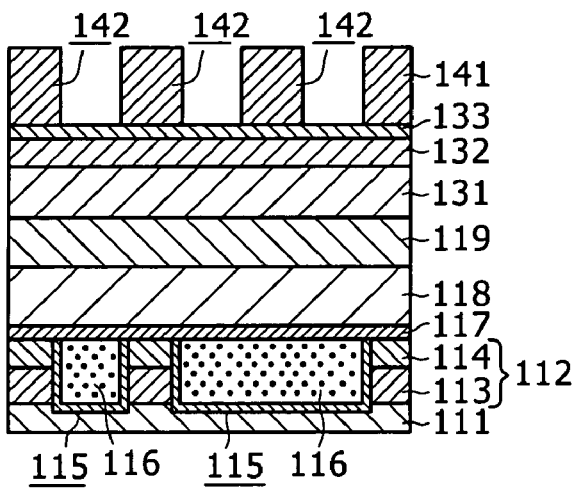
FIGS. 9A to 9F are schematic sectional views showing one example of the method of manufacturing a semiconductor device according to the related art.
Figure 9B:
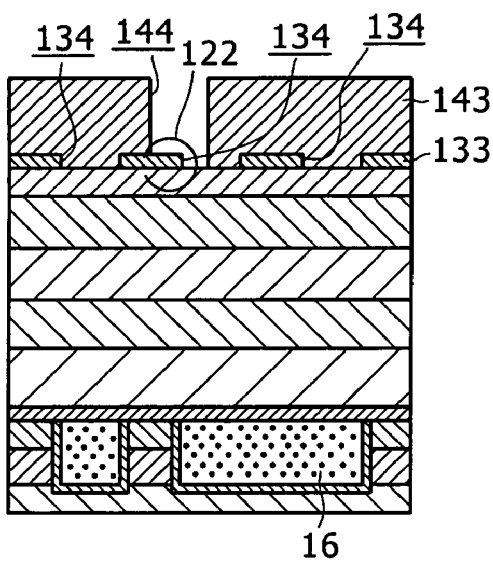
Figure 9C:
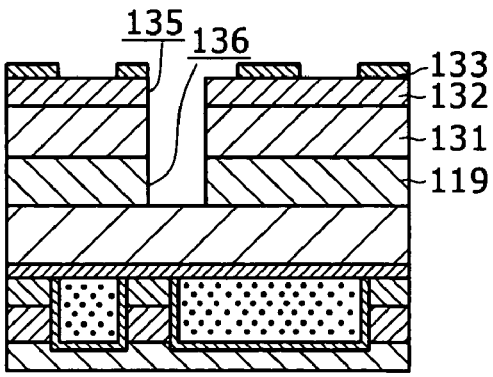
Figure 9D:
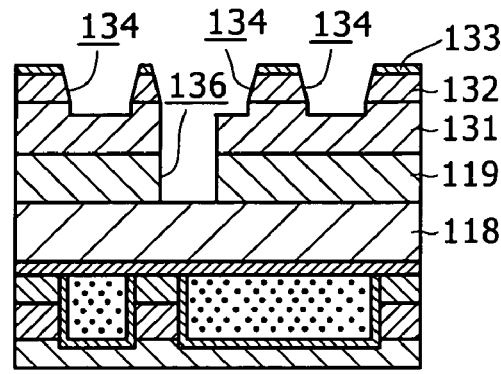
Figure 9E:
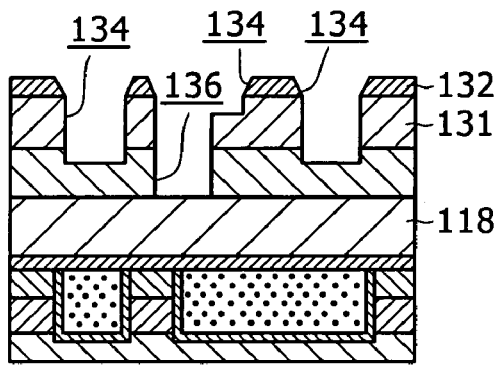
Figure 9F:
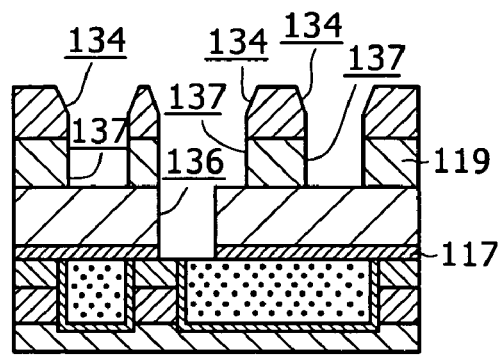
Figure 10A:
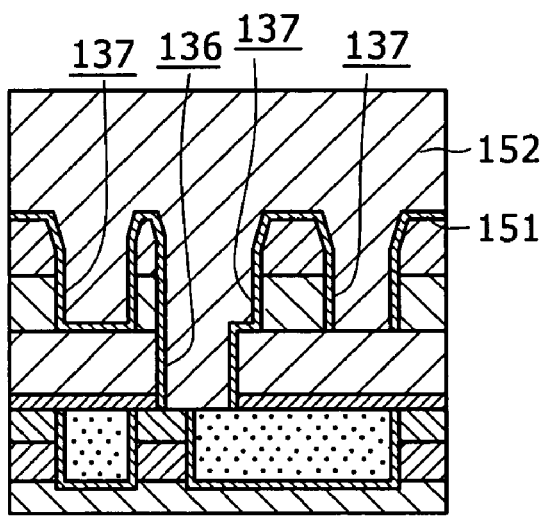
FIGS. 10A and 10B are schematic sectional views showing one example of the method of manufacturing a semiconductor device according to the related art.
Figure 10B:
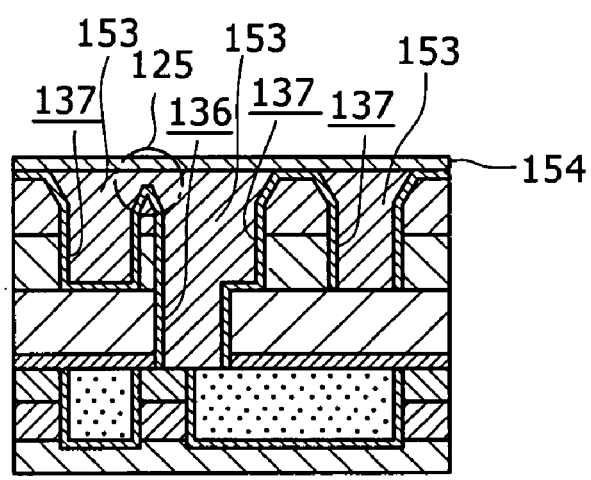

Further, of the copper film 52 and the barrier metal layer 51 deposited, the portions not necessary as the second wiring are removed by a chemical mechanical polishing (CMP) process, to complete the second wiring 53 in the wiring grooves 36 as shown in FIG. 8B, and parts thereof are connected to the first wiring 16 through the connection holes 35. By this, a multi-layer wiring structure of the so-called dual Damascene structure is obtained. The film thickness of the second wiring 53 to be a final upper layer wiring was regulated to about 170 nm, for example. Besides, similarly to the case of the first wiring 16 serving as the lower layer wiring, an oxidation inhibitive layer 54 covering the second wiring 53 is formed by use of an SiC film, for example.

In the multi-layer wiring of the so-called dual Damascene structure formed through the manufacturing steps of the fourth embodiment described above, the formation of the wiring grooves 36 by use of the laminated first mask layer 31 and second mask layer 32 including the organic sacrificing layer 30 is conducted, whereby the wiring grooves 36 and the connection holes 35 with corner collapse suppressed can be formed. Therefore, prevention of shortcircuits with the adjacent different-potential wiring and securing of a withstand voltage can be achieved. For example, the regions 23 between the wirings 53 and 53 can be maintained at such a sufficient interval that inter-wiring shortcircuit would not occur and that a withstand voltage is secured. Therefore, the semiconductor device manufactured through the multi-layer wiring process including at least the above-mentioned steps can be obtained in high yield.

Incidentally, each of the various interlayer insulation films described above is not limited to the kind of film, film thickness and manufacturing method mentioned above. The oxidation inhibitive layers 17 and 54 for Cu films may be SiN films formed by a CVD process, and SiC films containing a light element such as nitrogen (N) and hydrogen (H) may also be used.

The laminate structure of the SiOC film of the first insulation film 18 to be an inter-layer film provided with the connection holes 35 and the SiOC film of the second insulation film 19 to be an inter-layer film provided with the wiring grooves 36 may be produced by use of a single SiOC film, and the dielectric constant is not limited to the value of 2.6 or 3.0, so long as there is no problem as to etching performance, CMP endurance or wiring reliability. In addition, a different SiOC film may be adopted for only the protective film polished by CMP. Similarly, an SiOF film or $SiO_2$ film formed by a CVD process or a methylsilsesquioxane (MSQ) film or hydrogensilsesquioxane (HSQ) film formed by a spin coating process may be adopted in place of the SiOC film, and, further, an MSQ film having a porous structure and a dielectric constant of not more than 2.2 or a combination of these films may also be used.

In addition, while the organic sacrificing layer 30, the first mask layer 31 and the second mask layer 32 were composed respectively of the polyaryl ether film (150 nm), the SiN film (50 nm) and the $SiO_2$ film (35 nm) in this order from the lower side, which represent the kinds of films, film thicknesses and manufacturing methods in such a combination that a lower layer mask can be etched by use of an upper layer mask, the structure is not limited to the details of the above description, inasmuch as the structure ensures that the close contact property and thermal resistance property after lamination can endure the subsequent etching steps. For example, the SiN film of the first mask layer 31 may be an SiC film or SiCN film formed by a CVD process, and can be thinned inasmuch as the etching selectivity ratio permits. Similarly, the second mask layer 32 serving as the uppermost layer may be an amorphous silicon film formed by a sputtering process. Further, the organic sacrificing layer 30 may be formed by applying a resist material such as a novolak resin, the CVD films of the first and second mask layers 31 and 32 may be formed at a low temperature of 200 to 350° C., and the first and second mask layers 31 and 32 themselves may be composed of coating type materials.

According to the manufacturing method described in the fourth embodiment, the same functions or effects as in the third embodiment can be obtained. Simultaneously, by forming the etching mask structure composed of the first and second mask layers 31 and 32 including the organic sacrificing layer 30, the corner collapse shape of the wiring grooves 36 was further improved, the requirement for miniaturization down to a half-pitch of 60 nm or below in the 32 nm generation and the latter generations and the requirement for a lowering in dielectric constant down to 2.2 or below were met, and prevention of shortcircuits between the wiring grooves 36 and the connection holes 35 and securing of a withstand voltage were realized.

In each of the above embodiments, it is desirable that the organic sacrificing layer 30, the first mask layer 31 and the second mask layer 32 are formed of such materials that a lower layer can be etched by use of an upper layer as a mask. In view of this, various examples of the materials applicable to the first mask layer 31 and the second mask layer 32 used in each of the embodiments will be mentioned, and, further, etching chemical species to be used in etching the materials will be mentioned. Besides, the materials used for the first mask layer 31 and the second mask layer 32 can serve as masks at the time of etching an organic film.

For example, in the case where a silicon oxide ($SiO_2$) film or an SOG (Spin on glass) film is used for the second mask layer 32, films which can be used for the first mask layer 31 include silicon nitride (SiN) film, silicon oxynitride (SiCN) film, silicon carbide (SiC) film, silicon carbonitride (SiCN) film, silicon (Si) film, aluminum oxide (AlO) film, tantalum (Ta) film, tantalum nitride (TaN) film, titanium (Ti) film, titanium nitride (TiN) film, tungsten (W) film, and tungsten nitride (WN) film.

In the case where a silicon oxide ($SiO_2$) film or an SOG (Spin on glass) film is used for the second mask layer 32, the etching chemical species for use in etching the second mask layer 32 include a mixture gas of octafluorocyclobutane ($C_4H_8$), carbon monoxide (CO) and argon (Ar).

In the case where a silicon oxide ($SiO_2$) film or an SOG (Spin on glass) film is used for the second mask layer 32 and a silicon nitride (SiN) film, a silicon oxynitride (SiON) film, a silicon carbide (SiC) film or a silicon carbonitride (SiCN) film is used for the first mask layer 31, the etching chemical species for use in etching the first mask layer 31 include a mixture gas of difluoromethane ($CH_2F_2$), oxygen ($O_2$) and argon (Ar).

In the case where a silicon oxide ($SiO_2$) film or an SOG (Spin on glass) film is used for the second mask layer 32 and a silicon (Si) film is used for the first mask layer 31, the etching chemical species for use in etching the first mask layer 31 include a mixture gas of chlorine ($Cl_2$), hydrogen bromide (HBr) and oxygen ($O_2$).

In the case where a silicon oxide ($SiO_2$) film or an SOG (Spin on glass) film is used for the second mask layer 32 and an aluminum oxide (AlO) film is used for the first mask layer 31, the etching chemical species for use in etching the first mask layer 31 include a mixture gas of tetrafluoromethane ($CF_4$) and argon (Ar).

In the case where a silicon oxide ($SiO_2$) film or an SOG (Spin on glass) film is used for the second mask layer 32 and a tantalum (Ta) film, a tantalum nitride (TaN) film, a titanium (Ti) film or a titanium nitride (TiN) film is used for the first mask layer 31, the etching chemical species for use in etching the first mask layer 31 include a mixture gas of boron trichloride ($BCl_3$) and chlorine ($Cl_2$).

In the case where a silicon oxide ($SiO_2$) film or an SOG (Spin on glass) film is used for the second mask layer 32 and a tungsten (W) film or a tungsten nitride (WN) film is used for the first mask layer 31, the etching chemical species for use in etching the first mask layer 31 include a mixture gas of sulfur hexafluoride ($SF_6$) and argon (Ar).

In the case where a silicon nitride (SiN) film, a silicon oxynitride (SiON) film, a silicon carbide (SiC) film or a silicon carbonitride (SiCN) film is used for the second mask layer 32, films which can be used for the first mask layer 31 include silicon oxide ($SiO_2$) film, SOG (Spin on glass) film, silicon (Si) film, tantalum (Ta) film, tantalum nitride (TaN) film, titanium (Ti) film, titanium nitride (TiN) film, tungsten (W) film, and tungsten nitride (WN) film.

In the case where a silicon nitride (SiN) film, a silicon oxynitride (SiON) film, a silicon carbide (SiC) film or a silicon carbonitride (SiCN) film is used for the second mask layer 32, the etching chemical species for use in etching the second mask layer 32 include a mixture gas of difluoromethane ($CH_2F_2$), oxygen ($O_2$) and argon (Ar).

In the case where a silicon nitride (SiN) film, a silicon oxynitride (SiON) film, a silicon carbide (SiC) film or a silicon carbonitride (SiCN) film is used for the second mask layer 32 and a silicon oxide ($SiO_2$) film or an SOG (Spin on glass) film is used for the first mask layer 31, the etching chemical species for use in etching the first mask layer 31 include a mixture gas of octafluorocyclobutane ($C_4F_8$), carbon monoxide (CO) and argon (Ar).

In the case where a silicon nitride (SiN) film, a silicon oxynitride (SiON) film, a silicon carbide (SiC) film or a silicon carbonitride (SiCN) film is used for the second mask layer 32 and a silicon (Si) film is used for the first mask layer 31, the etching chemical species for use in etching the first mask layer 31 include a mixture gas of chlorine ($Cl_2$), hydrogen bromide (HBr) and oxygen ($O_2$).

In the case where a silicon nitride (SiN) film, a silicon oxynitride (SiON) film, a silicon carbide (SiC) film or a silicon carbonitride (SiCN) film is used for the second mask layer 32 and a tantalum (Ta) film, a tantalum nitride (TaN) film, a titanium (Ti) film or a titanium nitride (TiN) film is used for the first mask layer 31, the etching chemical species for use in etching the first mask layer 31 include a mixture gas of boron trichloride ($BCl_3$) and chlorine ($Cl_2$).

In the case where a silicon nitride (SiN) film, a silicon oxynitride (SiON) film, a silicon carbide (SiC) film or a silicon carbonitride (SiCN) film is used for the second mask layer 32 and a tungsten (W) film or a tungsten nitride (WN) film is used for the first mask layer 31, the etching chemical species for use in etching the first mask layer 31 include a mixture gas of sulfur hexafluoride ($SF_6$) and argon (Ar).

In the case where a silicon (Si) film is used for the second mask layer 32, films which can be used for the first mask layer 31 include silicon oxide ($SiO_2$) film, SOG (Spin on glass) film, silicon nitride (SiN) film, silicon oxynitride (SiON) film, silicon carbide (SiC) film, silicon carbonitride (SiCN) film, aluminum oxide (AlO) film, tantalum (Ta) film, tantalum nitride (TaN) film, titanium (Ti) film, titanium nitride (TiN) film, tungsten (W) film, and tungsten nitride (WN) film.

In the case where a silicon (Si) film is used for the second mask layer 32, the etching chemical species for use in etching the second mask layer 32 include a mixture gas of chlorine ($Cl_2$), hydrogen bromide (HBr) and oxygen ($O_2$).

In the case where a silicon (Si) film is used for the second mask layer 32 and a silicon oxide ($SiO_2$) film or an SOG (Spin on glass) film is used for the first mask layer 31, the etching chemical species for use in etching the first mask layer 31 include a mixture gas of octafluorocyclobutane ($C_4F_8$), carbon monoxide (CO) and argon (Ar).

In the case where a silicon (Si) film is used for the second mask layer 32 and a silicon nitride (SiN) film, a silicon oxynitride (SiON) film, a silicon carbide (SiC) film or a silicon carbonitride (SiCN) film is used for the first mask layer 31, the etching chemical species for use in etching the first mask layer 31 include a mixture gas of difluoromethane ($CH_2F_2$), oxygen ($O_2$) and argon (Ar) In the case where a silicon (Si) film is used for the second mask layer 32 and an aluminum oxide (AlO) film is used for the first mask layer 31, the etching chemical species for use in etching the first mask layer 31 include a mixture gas of tetrafluoromethane ($CF_4$) and argon (Ar).

In the case where a silicon (Si) film is used for the second mask layer 32 and a tantalum (Ta) film, a tantalum nitride (TaN) film, a titanium (Ti) film or a titanium nitride (TiN) film is used for the first mask layer 31, the etching chemical species for use in etching the first mask layer 31 include a mixture gas of boron trichloride ($BCl_3$) and chlorine ($Cl_2$).

In the case where a silicon (Si) film is used for the second mask layer 32 and a tungsten (W) film or a tungsten nitride (WN) film is used for the first mask layer, the etching chemical species for use in etching the first mask layer 31 include a mixture gas of sulfur hexafluoride ($SF_6$) and argon (Ar).

In the case where an aluminum oxide (AlO) film is used for the second mask layer 32, films which can be used for the first mask layer 31 include silixon oxide ($SiO_2$) film, SOG (Spin on glass) film, silicon (Si) film, tantalum (Ta) film, tantalum nitride (TaN) film, titanium (Ti) film, titanium nitride (TiN) film, tungsten (W) film, and tungsten nitride (WN) film.

In the case where an aluminum oxide (AlO) film is used for the second mask layer 32, the etching chemical species for use in etching the second mask layer 32 include a mixture gas of tetrafluoromethane ($CF_4$) and argon (Ar).

In the case where an aluminum oxide (AlO) film is used for the second mask layer 32 and a silicon oxide (SiO$_2$) film or an SOG (Spin on glass) film is used for the first mask layer 31, the etching chemical species for use in etching the first mask layer 31 include a mixture gas of octafluorocyclobutane (C$_4$F$_8$), carbon monoxide (CO) and argon (Ar).

In the case where an aluminum oxide (AlO) film is used for the second mask layer 32 and a silicon (Si) film is used for the first mask layer 31, the etching chemical species for use in etching the first mask layer 31 include a mixture gas of chlorine (Cl$_2$), hydrogen bromide (HBr) and oxygen (O$_2$).

In the case where an aluminum oxide (AlO) film is used for the second mask layer 32 and a tantalum (Ta) film, a tantalum nitride (TaN) film, a titanium (Ti) film or a titanium nitride (TiN) film is used for the first mask layer 31, the etching chemical species for use in etching the first mask layer 31 include a mixture gas of boron trichloride (BCl$_3$) and chlorine (Cl$_2$)

In the case where an aluminum oxide (AlO) film is used for the second mask layer 32 and a tungsten (W) film or a tungsten nitride (WN) film is used for the first mask layer 31, the etching chemical species for use in etching the first mask layer 31 include a mixture gas of sulfur hexafluoride (SF$_6$) and argon (Ar).

In the case where a tantalum (Ta) film, a tantalum nitride (TaN) film, a titanium (Ti) film or a titanium nitride (TiN) film is used for the second mask layer 32, films which can be used for the first mask layer 31 include silicon oxide (SiO$_2$) film, SOG (Spin on glass) film, silicon (Si) film, silicon nitride (SiN) film, silicon oxynitride (SiON) film, silicon carbide (SiC) film, silicon carbonitride (SiCN) film, aluminum oxide (AlO) film, tungsten (W) film, and tungsten nitride (WN) film.

In the case where a tantalum (Ta) film, a tantalum nitride (TaN) film, a titanium (Ti) film or a titanium nitride (TiN) film is used for the second mask layer 32, the etching chemical species for use in etching the second mask layer 32 include a mixture gas of boron trichloride (BCl$_3$) and chlorine (Cl$_2$).

In the case where a tantalum (Ta) film, a tantalum nitride (TaN) film, a titanium (Ti) film or a titanium nitride (TiN) film is used for the second mask layer 32 and a silicon oxide (SiO$_2$) film or an SOG (Spin on glass) film is used for the first mask layer 31, the etching chemical species for use in etching the first mask layer 31 include a mixture gas of octafluorocyclobutane (C$_4$F$_8$), carbon monoxide (CO) and argon (Ar).

In the case where a tantalum (Ta) film, a tantalum nitride (TaN) film, a titanium (Ti) film or a titanium nitride (TiN) film is used for the second mask layer 32 and a silicon (Si) film is used for the first mask layer 31, the etching chemical species for use in etching the first mask layer 31 include a mixture gas of hydrogen bromide (HBr) and oxygen (O$_2$).

In the case where a tantalum (Ta) film, a tantalum nitride (TaN) film, a titanium (Ti) film or a titanium nitride (TiN) film is used for the second mask layer 32 and a silicon nitride (SiN) film, a silicon oxynitride (SiON) film, a silicon carbide (SiC) film or a silicon carbonitride (SiCN) film is used for the first mask layer 31, the etching chemical species for use in etching the first mask layer include a mixture gas of difluoromethane (CH$_2$F$_2$), oxygen (O$_2$) and argon (Ar).

In the case where a tantalum (Ta) film, a tantalum nitride (TaN) film, a titanium (Ti) film or a titanium nitride (TiN) film is used for the second mask layer 32 and an aluminum oxide (AlO) film is used for the first mask layer 31, the etching chemical species for use in etching the first mask layer 31 include a mixture gas of tetrafluoromethane (CF$_4$) and argon (Ar).

In the case where a tantalum (Ta) film, a tantalum nitride (TaN) film, a titanium (Ti) film or a titanium nitride (TiN) film is used for the second mask layer 32 and a tungsten (W) film or a tungsten nitride (WN) film is used for the first mask layer 31, the etching chemical species for use in etching the first mask layer 31 include a mixture gas of sulfur hexafluoride (SF6) and argon (Ar).

In the case where a tungsten (W) film or a tungsten nitride (WN) film is used for the second mask layer 32, films which can be used for the first mask layer 31 include silicon oxide (SiO$_2$) film, SOG (Spin on glass) film, silicon (Si) film, silicon nitride (SiN) film, silicon oxynitride (SiON) film, silicon carbide (SiC) film, silicon carbonitride (SiCN) film, aluminum oxide (AlO) film, tungsten (W) film, and tungsten nitride (WN) film.

In the case where a tungsten (W) film or a tungsten nitride (WN) film is used for the second mask layer 32, the etching chemical species for use in etching the second mask layer 32 include a mixture gas of sulfur hexafluoride (SF$_6$) and argon (Ar).

In the case where a tungsten (W) film or a tungsten nitride (WN) film is used for the second mask layer 32 and a silicon oxide (SiO$_2$) film or an SOG (Spin on glass) film is used for the first mask layer 31, the etching chemical species for use in etching the first mask layer 31 include a mixture gas of octafluorocyclobutane (C$_4$F$_8$), carbon monoxide (CO) and argon (Ar).

In the case where a tungsten (W) film or a tungsten nitride (WN) film is used for the second mask layer 32 and a silicon (Si) film is used for the first mask layer 31, the etching chemical species for use in etching the first mask layer 31 include a mixture gas of chlorine (Cl$_2$), hydrogen bromide (HBr) and oxygen (O$_2$).

In the case where a tungsten (W) film or a tungsten nitride (WN) film is used for the second mask layer 32 and a silicon nitride (SiN) film, a silicon oxynitride (SiON) film, a silicon carbide (SiC) film or a silicon carbonitride (SiCN) film is used for the first mask layer 31, the etching chemical species for use in etching the first mask layer 31 include a mixture gas of difluoromethane (CH$_2$F$_2$), oxygen (O$_2$) and argon (Ar).

In the case where a tungsten (W) film or a tungsten nitride (WN) film is used for the second mask layer 32 and an aluminum oxide (AlO) film is used for the first mask layer 31, the etching chemical species for use in etching the first mask layer 31 include a mixture gas of tetrafluoromethane (CF$_4$) and argon (Ar).

In the case where a tungsten (W) film or a tungsten nitride (WN) film is used for the second mask layer 32 and a tantalum (Ta) film, a tantalum nitride (TaN) film, a titanium (Ti) film or a titanium nitride (TiN) film is used for the first mask layer 31, the etching chemical species for use in etching the first mask layer 31 include a mixture gas of boron trichloride (BCl$_3$) and chlorine (Cl$_2$).

The foregoing can be summarized in Tables 1 to 8 below.

TABLE 1

| Second mask layer | First mask layer | Etching chemical species for second mask layer | Etching chemical species for first mask layer |
|---|---|---|---|
| SiO$_2$ | SiN | C$_4$F$_8$/CO/Ar | CH$_2$F$_2$/O$_2$/Ar |
| | SiON | | |
| | SiC | | |
| | SiCN | | |
| | Si | | Cl$_2$/HBr/O$_2$ |

TABLE 1-continued

| Second mask layer | First mask layer | Etching chemical species for second mask layer | Etching chemical species for first mask layer |
|---|---|---|---|
| | AlO | | $CF_4/Ar$ |
| | Ta | | $BCl_3/Cl_2$ |
| | TaN | | |
| | Ti | | |
| | TiN | | |
| | W | | $SF_6/Ar$ |
| | WN | | |
| SOG | SiN | $C_4F_8/CO/Ar$ | $CH_2F_2/O_2/Ar$ |
| | SiON | | |
| | SiC | | |
| | SiCN | | |
| | Si | | $Cl_2/HBr/O_2$ |
| | AlO | | $CF_4/Ar$ |
| | Ta | | $BCl_3/Cl_2$ |
| | TaN | | |
| | Ti | | |
| | TiN | | |
| | W | | $SF_6/Ar$ |
| | WN | | |

TABLE 2

| Second mask layer | First mask layer | Etching chemical species for second mask layer | Etching chemical species for first mask layer |
|---|---|---|---|
| SiN | $SiO_2$ | $CH_2F_2/O_2/Ar$ | $C_4F_8/CO/Ar$ |
| | SOG | | |
| | Si | | $Cl_2/HBr/O_2$ |
| | Ta | | $BCl_3/Cl_2$ |
| | TaN | | |
| | Ti | | |
| | TiN | | |
| | W | | $SF_6/Ar$ |
| | WN | | |
| SiON | $SiO_2$ | $CH_2F_2/O_2/Ar$ | $C_4F_8/CO/Ar$ |
| | SOG | | |
| | Si | | $Cl_2/HBr/O_2$ |
| | Ta | | $BCl_3/Cl_2$ |
| | TaN | | |
| | Ti | | |
| | TiN | | |
| | W | | $SF_6/Ar$ |
| | WN | | |

TABLE 3

| Second mask layer | First mask layer | Etching chemical species for second mask layer | Etching chemical species for first mask layer |
|---|---|---|---|
| SiC | $SiO_2$ | $CH_2F_2/O_2/Ar$ | $C_4F_8/CO/Ar$ |
| | SOG | | |
| | Si | | $Cl_2/HBr/O_2$ |
| | Ta | | $BCl_3/Cl_2$ |
| | TaN | | |
| | Ti | | |
| | TiN | | |
| | W | | $SF_6/Ar$ |
| | WN | | |
| SiCN | $SiO_2$ | $CH_2F_2/O_2/Ar$ | $C_4F_8/CO/Ar$ |
| | SOG | | |
| | Si | | $Cl_2/HBr/O_2$ |

TABLE 3-continued

| Second mask layer | First mask layer | Etching chemical species for second mask layer | Etching chemical species for first mask layer |
|---|---|---|---|
| | Ta | | $BCl_3/Cl_2$ |
| | TaN | | |
| | Ti | | |
| | TiN | | |
| | W | | $SF_6/Ar$ |
| | WN | | |

TABLE 4

| Second mask layer | First mask layer | Etching chemical species for second mask layer | Etching chemical species for first mask layer |
|---|---|---|---|
| Si | $SiO_2$ | $Cl_2/HBr/O_2$ | $C_4F_8/CO/Ar$ |
| | SOG | | |
| | SiN | | $CH_2F_2/O_2/Ar$ |
| | SiON | | |
| | SiC | | |
| | SiCN | | |
| | AlO | | $CF_4/Ar$ |
| | Ta | | $BCl_3/Cl_2$ |
| | TaN | | |
| | Ti | | |
| | TiN | | |
| | W | | $SF_6/Ar$ |
| | WN | | |
| AlO | $SiO_2$ | $C_4F_8/CO/Ar$ | $C_4F_8/CO/Ar$ |
| | SOG | | |
| | Si | | $Cl_2/HBr/O_2$ |
| | AlO | | $CF_4/Ar$ |
| | Ta | | $BCl_3/Cl_2$ |
| | TaN | | |
| | Ti | | |
| | TiN | | |
| | W | | $SF_6/Ar$ |
| | WN | | |

TABLE 5

| Second mask layer | First mask layer | Etching chemical species for second mask layer | Etching chemical species for first mask layer |
|---|---|---|---|
| SiC | $SiO_2$ | $CH_2F_2/O_2/Ar$ | $C_4F_8/CO/Ar$ |
| | SOG | | |
| | Si | | $Cl_2/HBr/O_2$ |
| | Ta | | $BCl_3/Cl_2$ |
| | TaN | | |
| | Ti | | |
| | TiN | | |
| | W | | $SF_6/Ar$ |
| | WN | | |
| SiCN | $SiO_2$ | $CH_2F_2/O_2/Ar$ | $C_4F_8/CO/Ar$ |
| | SOG | | |
| | Si | | $Cl_2/HBr/O_2$ |
| | Ta | | $BCl_3/Cl_2$ |
| | TaN | | |
| | Ti | | |
| | TiN | | |
| | W | | $SF_6/Ar$ |
| | WN | | |

TABLE 6

| Second mask layer | First mask layer | Etching chemical species for second mask layer | Etching chemical species for first mask layer |
|---|---|---|---|
| Ta | $SiO_2$ | $BCl_3/Cl_2$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | W |  | $SF_6/Ar$ |
|  | WN |  |  |
| TaN | $SiO_2$ | $BCl_3/Cl_2$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | W |  | $SF_6/Ar$ |
|  | WN |  |  |

TABLE 7

| Second mask layer | First mask layer | Etching chemical species for second mask layer | Etching chemical species for first mask layer |
|---|---|---|---|
| Ti | $SiO_2$ | $BCl_3/Cl_2$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | W |  | $SF_6/Ar$ |
|  | WN |  |  |
| TiN | $SiO_2$ | $BCl_3/Cl_2$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | W |  | $SF_6/Ar$ |
|  | WN |  |  |

TABLE 8

| Second mask layer | First mask layer | Etching chemical species for second mask layer | Etching chemical species for first mask layer |
|---|---|---|---|
| W | $SiO_2$ | $SF_6/Ar$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | Ta |  | $BCl_3/Cl_2$ |
|  | TaN |  |  |
|  | Ti |  |  |
|  | TiN |  |  |

TABLE 8-continued

| Second mask layer | First mask layer | Etching chemical species for second mask layer | Etching chemical species for first mask layer |
|---|---|---|---|
| WN | $SiO_2$ | $SF_6/Ar$ | $C_4F_8/CO/Ar$ |
|  | SOG |  |  |
|  | Si |  | $Cl_2/HBr/O_2$ |
|  | SiN |  | $CH_2F_2/O_2/Ar$ |
|  | SiON |  |  |
|  | SiC |  |  |
|  | SiCN |  |  |
|  | AlO |  | $CF_4/Ar$ |
|  | Ta |  | $BCl_3/Cl_2$ |
|  | TaN |  |  |
|  | Ti |  |  |
|  | TiN |  |  |

Further, in each of the above embodiments, it is desirable that the organic sacrificing layer 30, the first mask layer 31 and the second mask layer 32 are formed of light-transmitting materials. By forming these layers from light-transmitting materials, optical alignment can be conducted from the upper side of the films in the light exposure step. This makes it possible to enhance the mask alignment accuracy, thereby making it possible to minimize the alignment errors and achieve a highly accurate patterning.

The method of manufacturing a semiconductor device according to the present invention is preferably applied to multi-layer wiring for various semiconductor integrated circuits.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising the steps of:
    laminating a first insulation film and a second insulation film which includes an organic insulation film, on a substrate;
    sequentially laminating an organic sacrificing layer, a first mask layer and a second mask layer on said second insulation film;
    forming a wiring groove pattern for processing a wiring groove in said second mask layer;
    forming a connection hole pattern for forming a connection hole in said second mask layer, said first mask layer and said organic sacrificing layer;
    forming a wiring groove pattern in said first mask layer and said organic sacrificing layer and forming a connection hole in said second insulation film, by etching using said second mask layer and said first mask layer as an etching mask; and
    forming a wiring groove in said second insulation film and forming a connection hole in said second insulation film and said first insulation film, by using said first mask layer and said organic sacrificing layer as a mask.

2. A method of manufacturing a semiconductor device as set forth in claim 1, wherein said second insulation film is comprised of an organic insulation film, and a protective film formed on said organic insulation film.

3. A method of manufacturing a semiconductor device as set forth in claim 2, wherein said organic sacrificing layer is removed at the time of forming said wiring groove in said organic insulation film in said second insulation film.

4. A method of manufacturing a semiconductor device as set forth in claim 1, wherein said organic sacrificing layer, said first mask layer and said second mask layer are formed by use of a light-transmitting material.

5. A method of manufacturing a semiconductor device as set forth in claim 1, wherein said organic sacrificing layer, said first mask layer and said second mask layer are formed by use of materials which ensure that a lower layer can be etched by using an upper layer as a mask.

6. A method of manufacturing a semiconductor device as set forth in claim 1, wherein
said first insulation film is comprised of a carbon-containing silicon oxide film; and
said second insulation film is comprised of a film formed by laminating an organic film and a carbon-containing silicon oxide film.

7. A method of manufacturing a semiconductor device as set forth in claim 1, wherein said connection hole is formed in said wiring groove pattern in said step of forming said connection hole pattern for forming said connection hole in said second mask layer, said first mask layer and said organic sacrificing layer.

8. A method of manufacturing a semiconductor device as set forth in claim 7, wherein said second insulation film is comprised of an organic insulation film, and a protective film formed on said organic insulation film.

9. A method of manufacturing a semiconductor device as set forth in claim 7, wherein said organic sacrificing layer is removed at the time of forming said wiring groove in said organic insulation film in said second insulation film.

10. A method of manufacturing a semiconductor device as set forth in claim 7, wherein said organic sacrificing layer, said first mask layer and said second mask layer are formed by use of a light-transmitting material.

11. A method of manufacturing a semiconductor device as set forth in claim 7, wherein said organic sacrificing layer, said first mask layer and said second mask layer are formed by use of materials which ensure that a lower layer can be etched by use of an upper layer as a mask.

12. A method of manufacturing a semiconductor device as set forth in claim 7, wherein
said first insulation film is formed by use of a carbon-containing silicon oxide film; and
said second insulation film is comprised of a film formed by laminating an organic film and a carbon-containing silicon oxide film.

13. A method of manufacturing a semiconductor device as set forth in claim 1, wherein said second insulation film is comprised of an inorganic insulation film.

14. A method of manufacturing a semiconductor device as set forth in claim 13, wherein said organic sacrificing layer is removed at the time of forming said wiring groove in said second insulation film and forming said connection hole in said first insulation film.

15. A method of manufacturing a semiconductor device as set forth in claim 13, wherein said organic sacrificing layer, said first mask layer and said second mask layer are formed by use of a light-transmitting material.

16. A method of manufacturing a semiconductor device as set forth in claim 13, wherein said organic sacrificing layer, said first mask layer and said second mask layer are formed by use of materials which ensure that a lower layer can be etched by use of an upper layer as a mask.

17. A method of manufacturing a semiconductor device as set forth in claim 13, wherein
said first insulation film is comprised of a carbon-containing silicon oxide film; and
said second insulation film is comprised of a carbon-containing silicon oxide film.

18. A method of manufacturing a semiconductor device as set forth in claim 13, wherein said connection hole is formed in said wiring groove pattern in said step of forming said connection hole pattern for forming said connection hole in said second mask layer, said first mask layer and said organic sacrificing layer.

19. A method of manufacturing a semiconductor device as set forth in claim 13, wherein said organic sacrificing layer is removed at the time of forming said wiring groove in said second insulation film and forming said connection hole in said first insulation film.

20. A method of manufacturing a semiconductor device as set forth in claim 18, wherein said organic sacrificing layer, said first mask layer and said second mask layer are formed by use of a light-transmitting material.

21. A method of manufacturing a semiconductor device as set forth in claim 18, wherein said organic sacrificing layer, said first mask layer and said second mask layer are formed by use of materials which ensure that a lower layer can be etched by use of an upper layer as a mask.

22. A method of manufacturing a semiconductor device as set forth in claim 18, wherein
said first insulation film is comprised of a carbon-containing silicon oxide film; and
said second insulation film is comprised of a carbon-containing silicon oxide film.

* * * * *